(12) United States Patent
Yun et al.

(10) Patent No.: US 10,181,524 B1
(45) Date of Patent: Jan. 15, 2019

(54) VERTICAL TRANSISTOR DEVICE AND METHOD FOR FABRICATING THE SAME

(71) Applicant: TAIWAN SEMICONDUCTOR MANUFACTURING CO., LTD., Hsinchu (TW)

(72) Inventors: Wei-Sheng Yun, Taipei (TW); Shao-Ming Yu, Hsinchu County (TW); Chih-Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/649,724

(22) Filed: Jul. 14, 2017

(51) Int. Cl.
| | |
|---|---|
| *H01L 29/78* | (2006.01) |
| *H01L 29/66* | (2006.01) |
| *H01L 27/105* | (2006.01) |
| *H01L 29/06* | (2006.01) |
| *H01L 29/423* | (2006.01) |
| *H01L 21/8234* | (2006.01) |

(52) U.S. Cl.
CPC .. *H01L 29/7827* (2013.01); *H01L 21/823418* (2013.01); *H01L 21/823487* (2013.01); *H01L 27/105* (2013.01); *H01L 29/0653* (2013.01); *H01L 29/42356* (2013.01); *H01L 29/66803* (2013.01); *H01L 29/7853* (2013.01)

(58) Field of Classification Search
CPC .......... H01L 29/66803; H01L 29/7858; H01L 29/7853
USPC .......................................... 257/214; 438/142
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,368,512 B1* | 6/2016 | Cheng ................ | H01L 27/1211 |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |

(Continued)

OTHER PUBLICATIONS

U.S. Appl. No. 15/631,012, filed Jun. 27, 2017.

*Primary Examiner* — David Vu
*Assistant Examiner* — Brandon Fox
(74) *Attorney, Agent, or Firm* — McClure, Qualey & Rodack, LLP

(57) ABSTRACT

A vertical transistor device and a method for fabricating the same are provided. The vertical transistor device includes a semiconductor substrate, first sources/drains and second sources/drains. The semiconductor substrate includes a bottom portion and fin portions located on the bottom portion. Each of the fin portions includes an upper portion and a lower portion. The lower portion is located between the bottom portion of the semiconductor substrate and the upper portion, in which the lower portion includes recesses. The first sources/drains are disposed on terminals of the upper portions of the fin portions. The second sources/drains are disposed on the recesses of the lower portions of the fin portions, in which the sources/drains are not merged with each other. In the method for fabricating the vertical transistor device, the lower portions of the fin portions are patterned to form the recesses on the lower portions of the fin portions.

20 Claims, 23 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 9,647,120 B1 * | 5/2017 | Bi .................... H01L 23/535 |
| 9,773,913 B1 * | 9/2017 | Balakrishnan .... H01L 29/78618 |
| 2016/0049480 A1 * | 2/2016 | Chang ............... H01L 29/41741 |
| | | 257/369 |
| 2016/0380058 A1 * | 12/2016 | Basker .............. H01L 21/32105 |
| | | 257/401 |
| 2018/0006024 A1 * | 1/2018 | Anderson ............ H01L 27/088 |

* cited by examiner

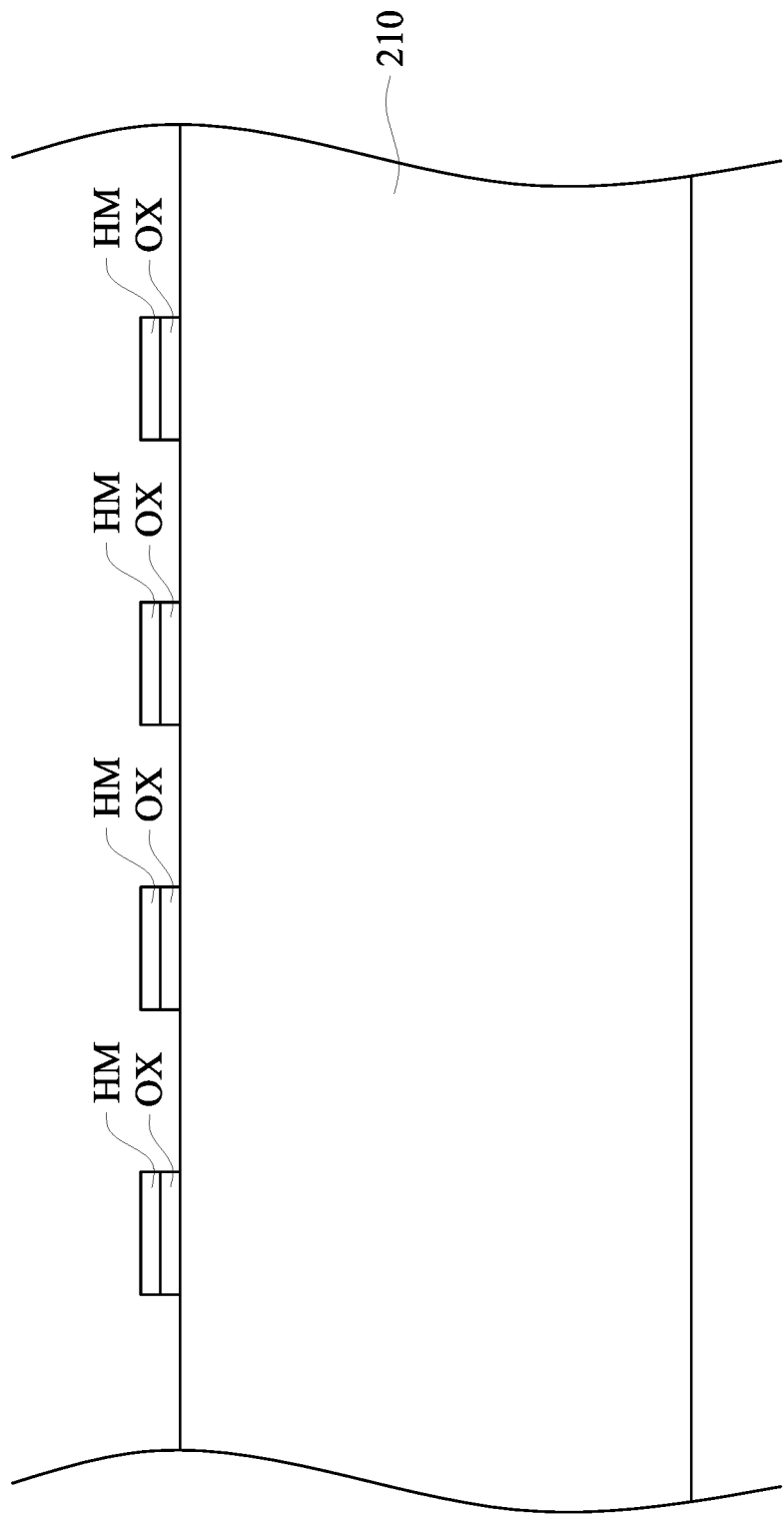

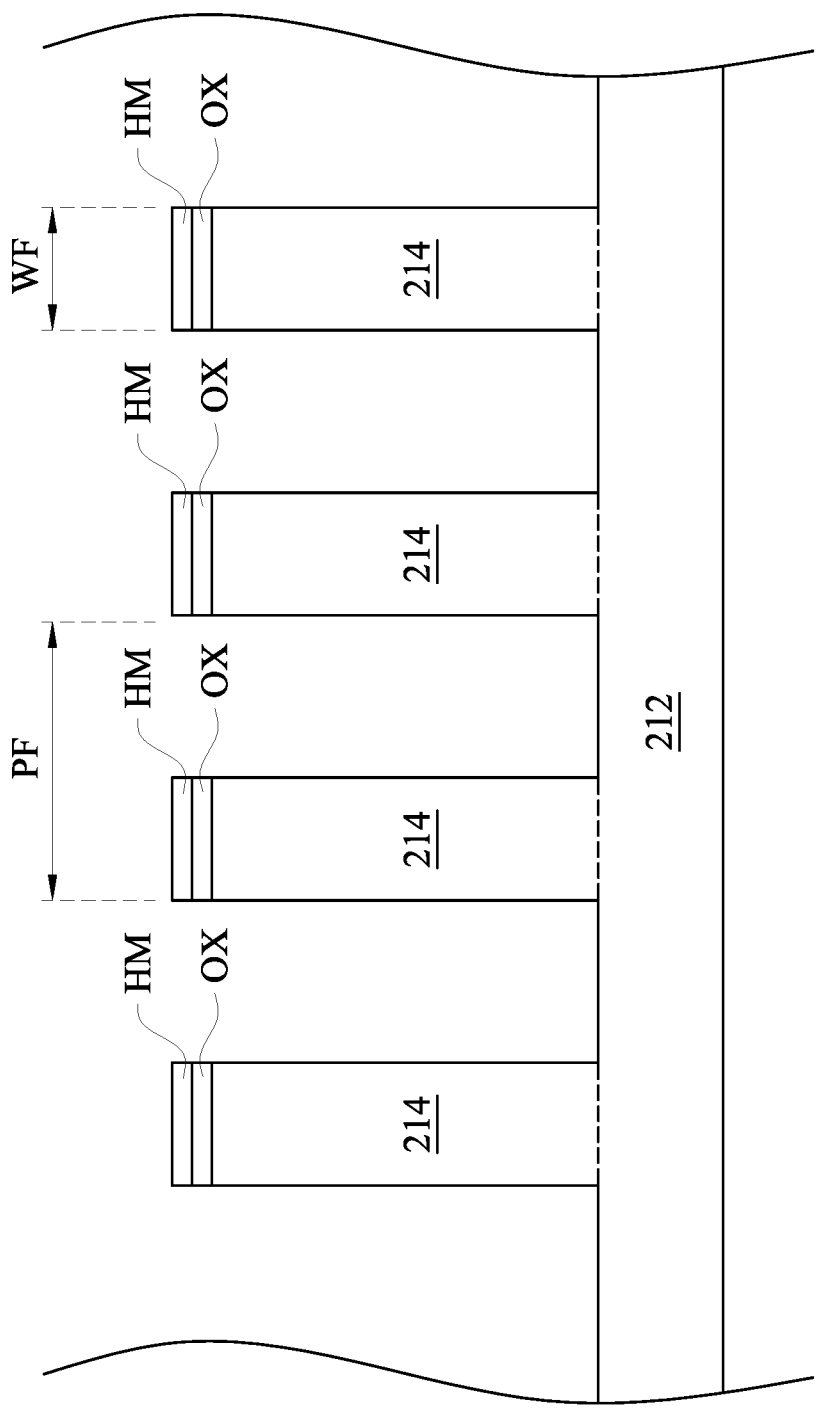

VERTICAL TRANSISTOR DEVICE AND METHOD FOR FABRICATING THE SAME

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

In order to form an integrated circuit device in a small area, vertical transistors are developed. In a typical vertical transistor, a conducting channel is provided by a silicon nanowire which perpendicular to a plane of an underlying semiconductor substrate. The vertical channel is surrounded by a three-dimensional gate structure. The three-dimensional gate structure can be referred to as vertical-gate-all-around (VGAA) configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
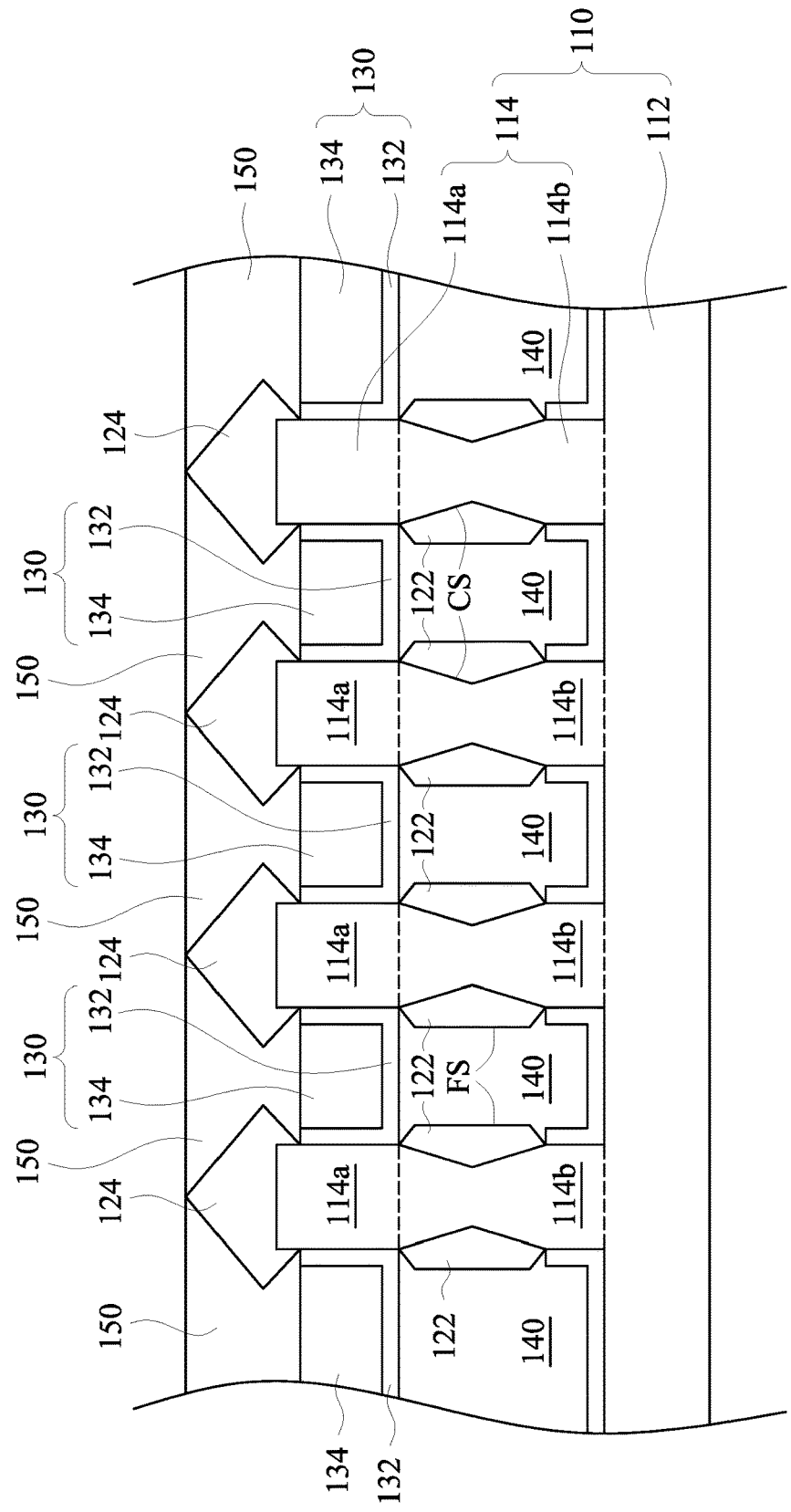
FIG. 1A and FIG. 1B are schematic cross-sectional views of transistor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are directed to a vertical transistor device and a method for fabricating the vertical transistor. The vertical transistor device includes a semiconductor substrate and plural sources/drains disposed on the semiconductor substrate. The semiconductor substrate includes a bottom portion and a fin portion located on the bottom portion. The fin portion includes an upper portion and a lower portion located between the bottom portion of the semiconductor substrate and the upper portion of the fin portion. The lower portion of the fin portion has plural recesses, and the sources/drains are formed on the recesses. Because the sources/drains are formed on the recesses, the formation of the sources/drains can be easily controlled to prevent merging of the sources/drains of adjacent two transistors.

Referring to FIG. 1A, FIG. 1A is a schematic cross-sectional view of a transistor device 100 in accordance with some embodiments of the present disclosure. The transistor device 100 includes a semiconductor substrate 110, plural sources 122 and drains 124, plural gate structures 130 and plural dielectric layers 140 and 150.

The semiconductor substrate 110 includes a bottom portion 112 and plural fin portions 114. In some embodiments, the semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The fin portions 114 are disposed on the bottom portion 112. Each of the fin portions 114 includes an upper portion 114a and a lower portion 114b. The lower portion 114b is located between the bottom portion 112 of the semiconductor substrate 110 and the upper portion 114a. The lower portion 114b has plural recesses CS. In some embodiments, the recesses CS are formed along a crystalline direction <111>. In some embodiments, the recesses CS are located on opposite sidewalls of the lower portion 114b.

The sources 122 are formed on the recesses CS. In some embodiments, the sources 122 are formed by using an epitaxial growth process. Because the recesses CS are formed along the crystalline direction <111>, the formation of the sources 122 can be easily controlled. For example, when the epitaxial growth process is performed to form the sources 122 on the recesses CS, the growth of the sources 122 can be easily controlled to prevent merging of the sources 122 formed on the recesses CS of adjacent two of the fin portions 114. Therefore, the sources 122 are not merged with each other. In other words, in a cross-sectional view of the sources 122, the sources 122 of adjacent two of the fin portions 114 are not merged with each other.

The gate structures 130 are formed on the upper portions 114a of the fin portions 114 to induce channels in the upper portions 114a of the fin portions. In some embodiments, the fin portions 114 are formed perpendicular to the plane of the bottom portion 112. Each of the gate structures 130 includes a gate dielectric layer 132 and a gate electrode 134 disposed on the gate dielectric layer 132. In some embodiments, the gate structures 130 are high-k metal gate structures. For example, the gate electrode 134 can be formed by metal, and the gate dielectric layer 132 may include hafnium oxide (HfO2), hafnium silicon oxide (HfSiO), hafnium silicon oxynitride (HfSiON), hafnium tantalum oxide (HMO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

The dielectric layers 140 are disposed between the lower portions 114b of the fin portions 114 to isolate the sources 122 from each other, and to provide support for the gate structures 130. In some embodiments, the dielectric layers 140 can be made by oxide, but embodiments of the present disclosure are not limited thereto.

The drains 124 are disposed on the terminals of the upper portions 114a of the fin portions 114. In some embodiments, the drains 124 are formed by using an epitaxial growth process, and the drains 124 are not merged with each other. In some embodiments, the positions of the drains 124 and the sources 122 can be exchanged. For example, the drains 124 can be disposed on the recesses CS of the lower portions 114b of the fin portions 114, and the sources 122 can be disposed on the terminals of the upper portions 114a of the fin portions 114.

The dielectric layers 150 are disposed between the drains 124 to isolate the drains 124 from each other. In some embodiments, the dielectric layers 150 can be made by oxide, but embodiments of the present disclosure are not limited thereto.

In some embodiments, silicide layers (not shown) can be formed on the sources 122 for contact landing. For example, the sources 122 disposed on adjacent two of the fin portions 114 have opposite front surfaces FS, and a first silicide layer is formed to cover the front surface FS of one of the sources 122, and a second silicide layer is formed to cover the front surface FS of another one of the sources 122. Then, a first contact is formed on the first silicide layer, and a second contact is formed on the second silicide layer.

Figure 1B:
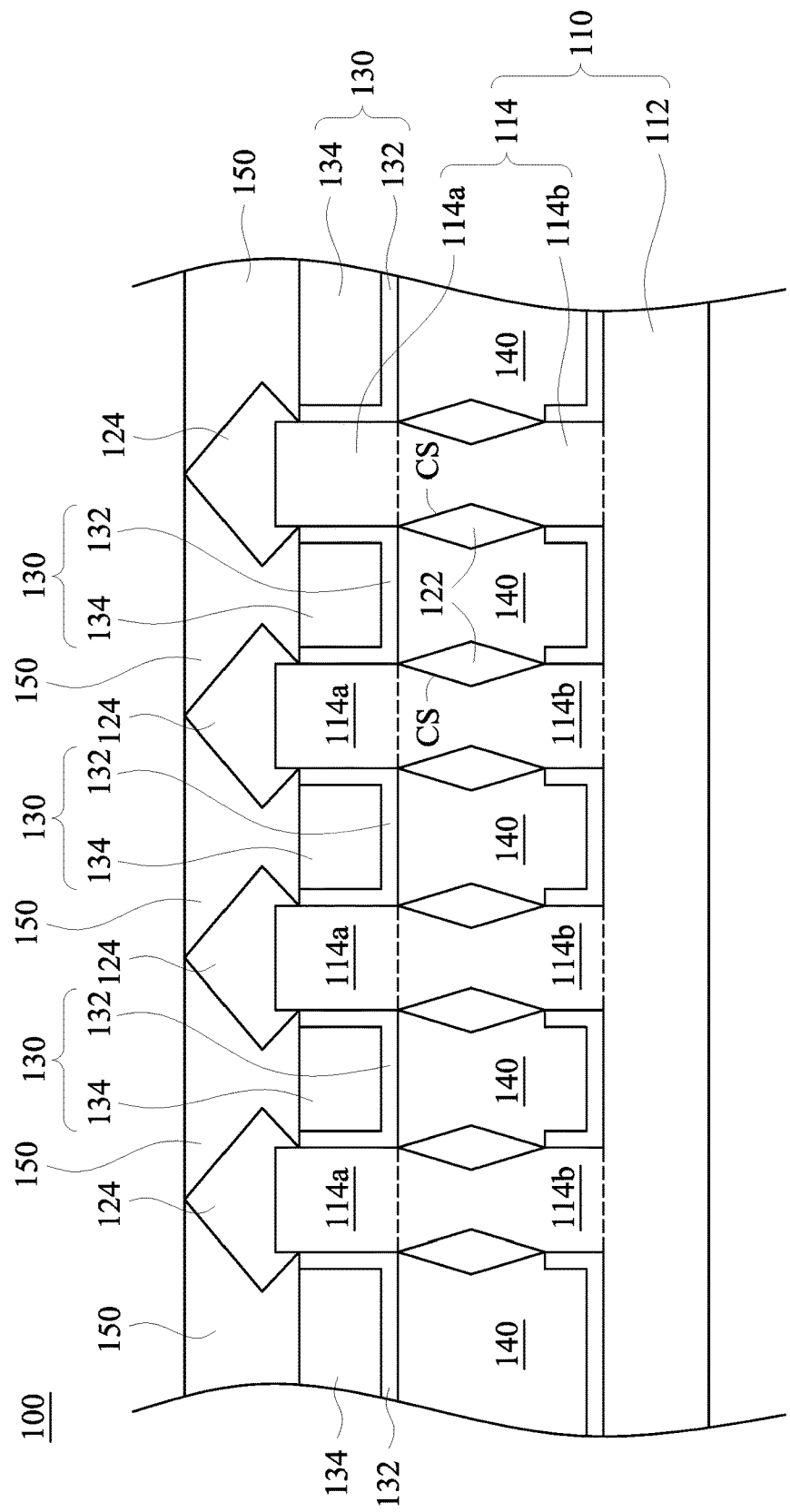

In the above embodiment, each of the sources 122 is formed to have a shape of rhombus, as shown in FIG. 1A. However, in some embodiments, each of the sources 122 is formed to have a shape of pentagon, as shown in FIG. 1B.

Figure 2A:
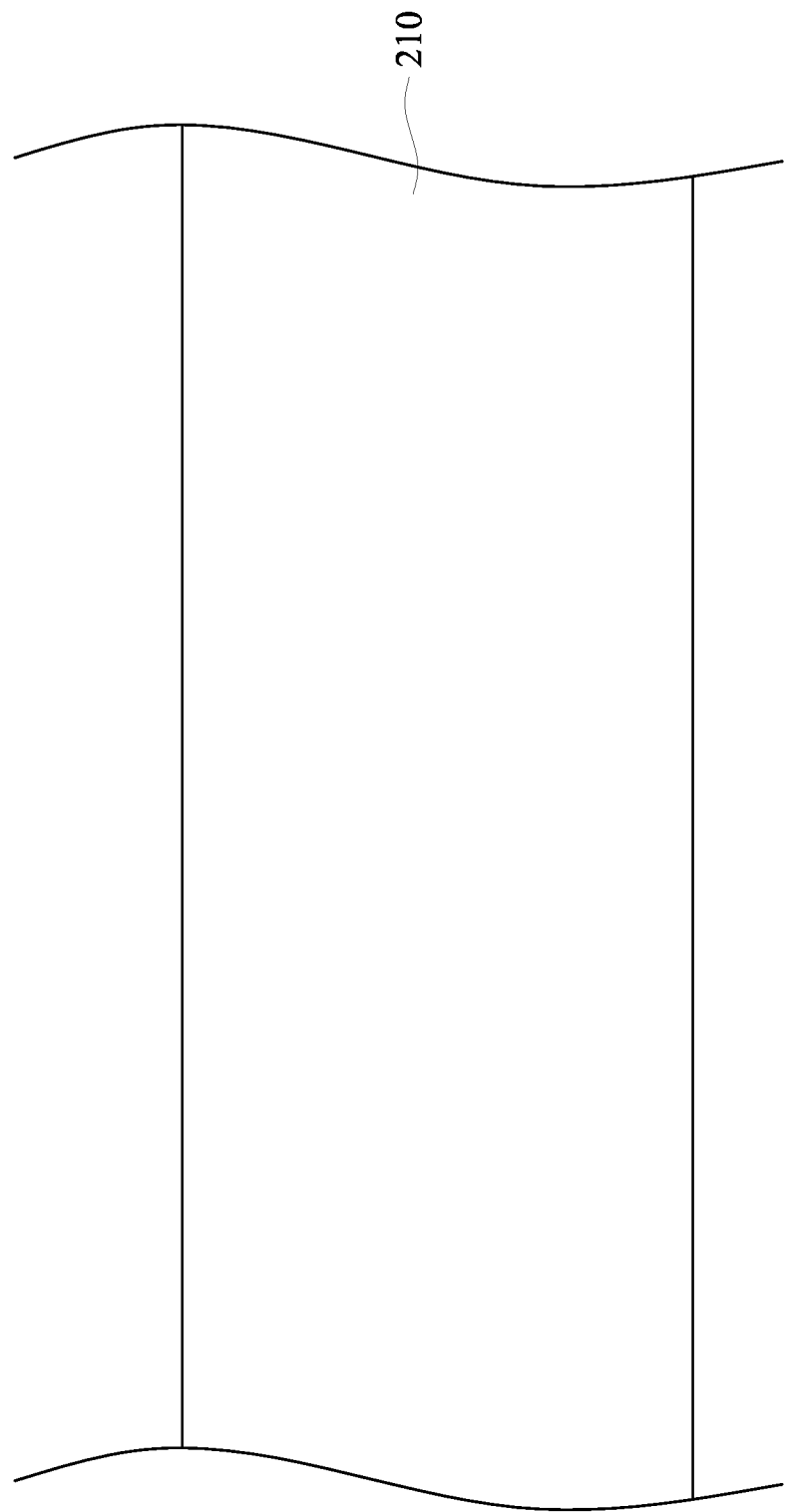
FIG. 2A to FIG. 2T are cross-sectional views of intermediate stages showing a method for fabricating a transistor device in accordance with some embodiments of the present disclosure.
Figure 2D:
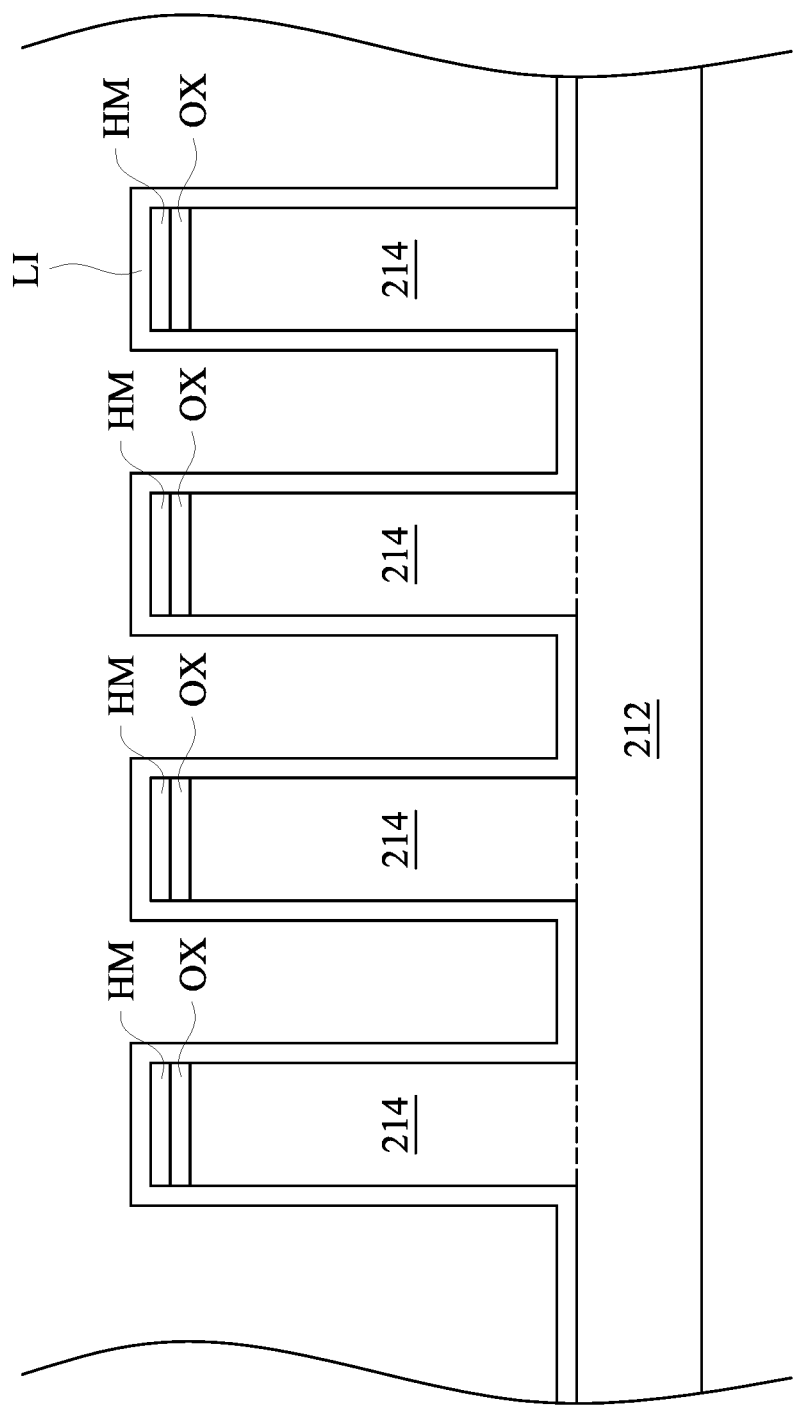
Figure 2E:
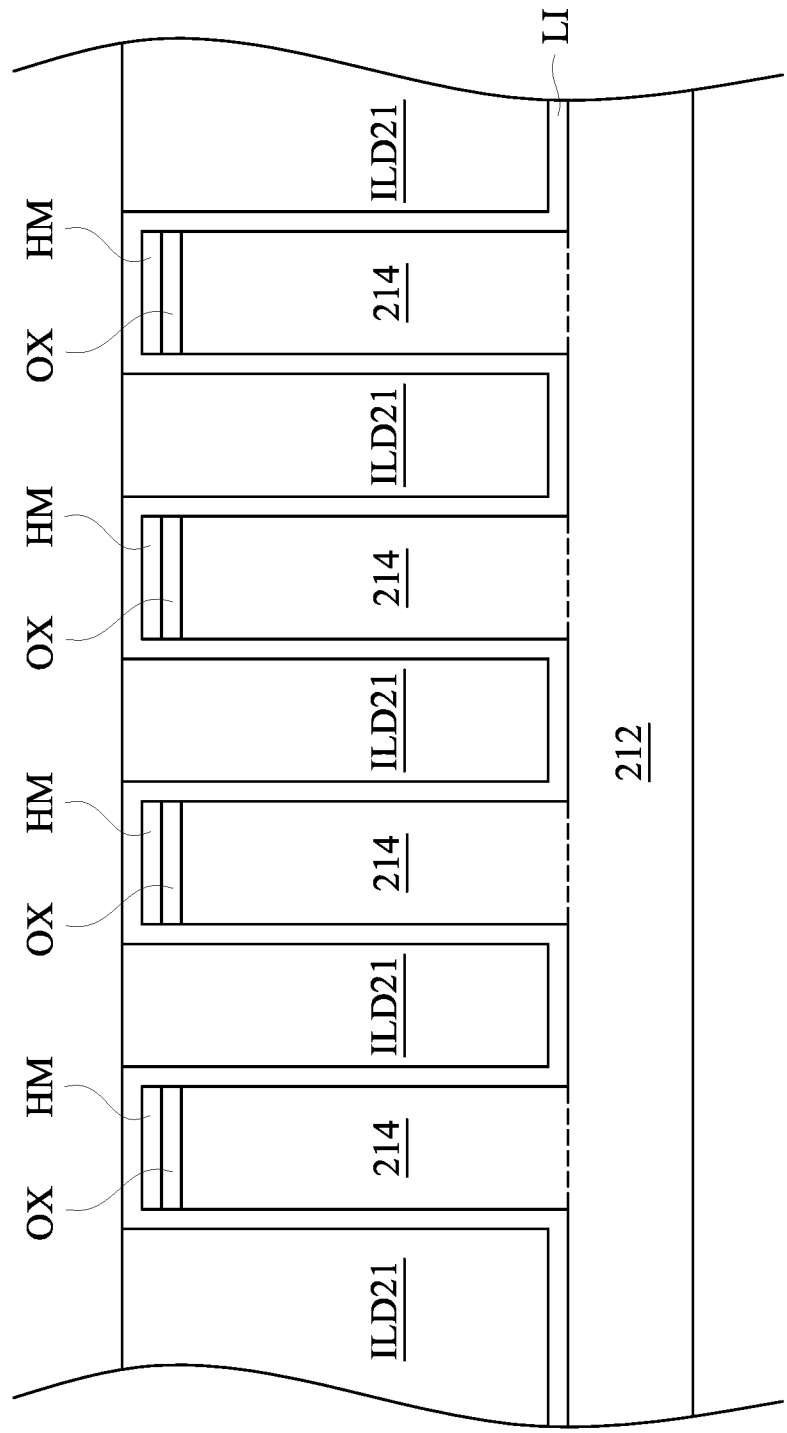
Figure 2F:
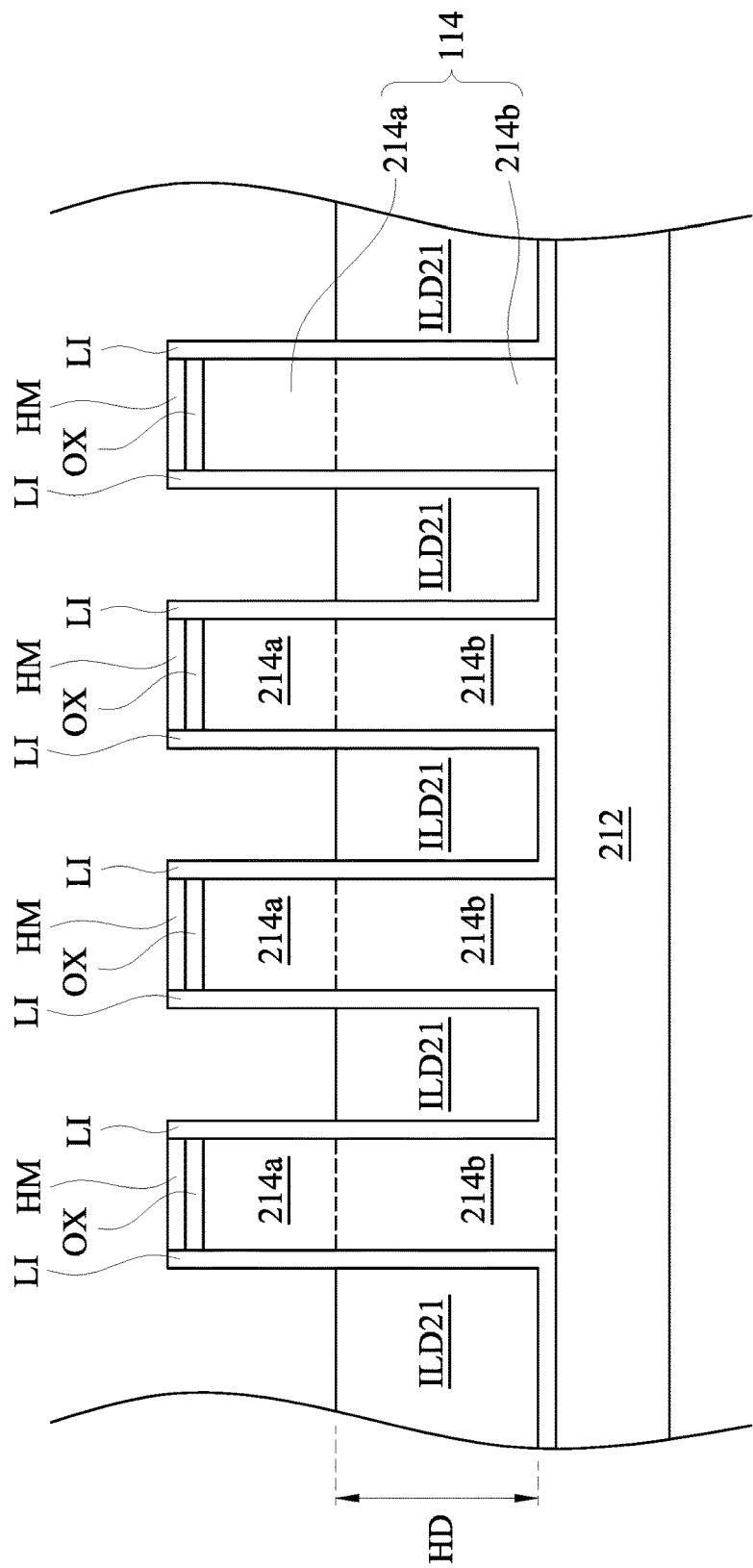
Figure 2G:
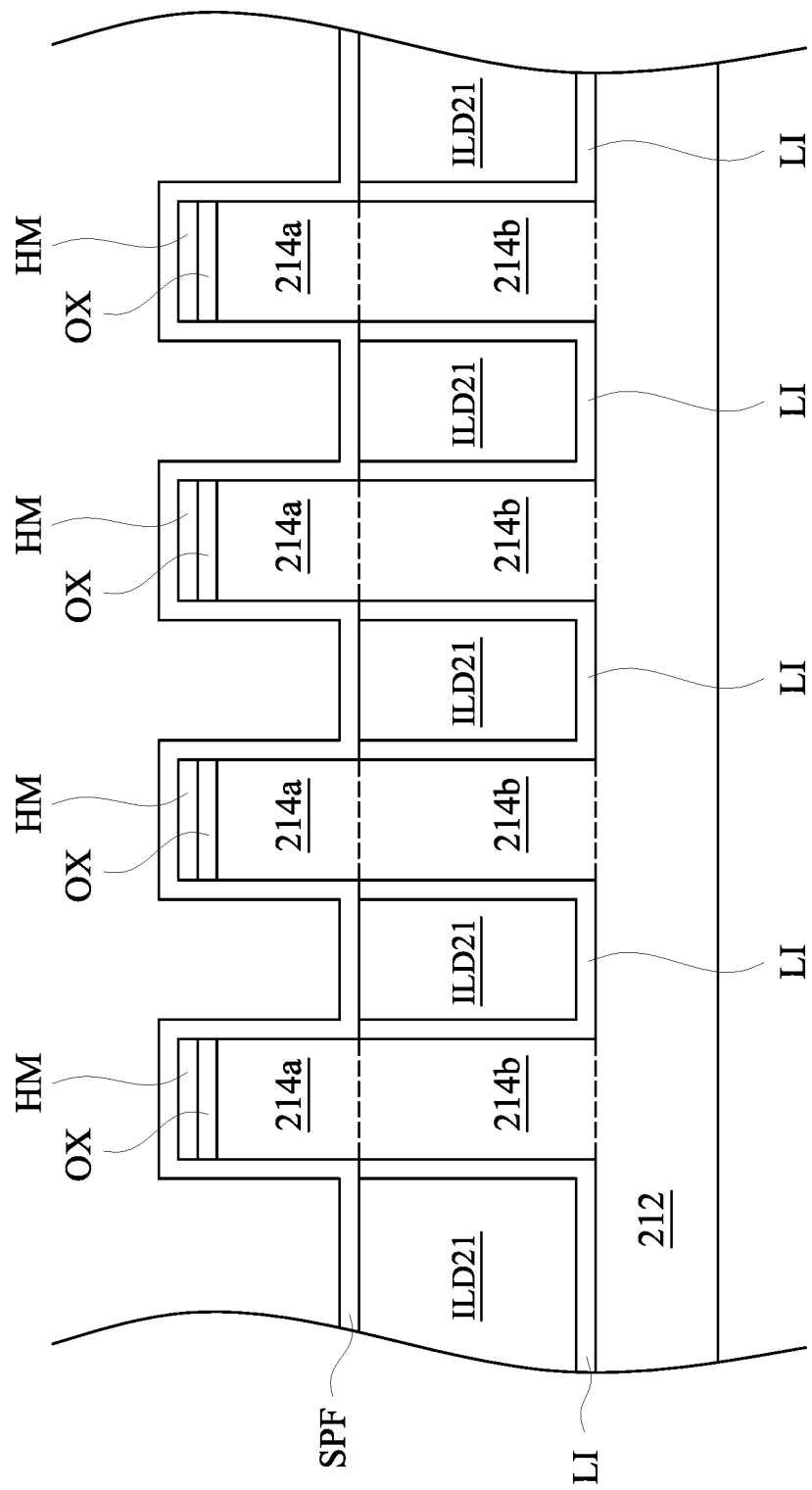
Figure 2H:
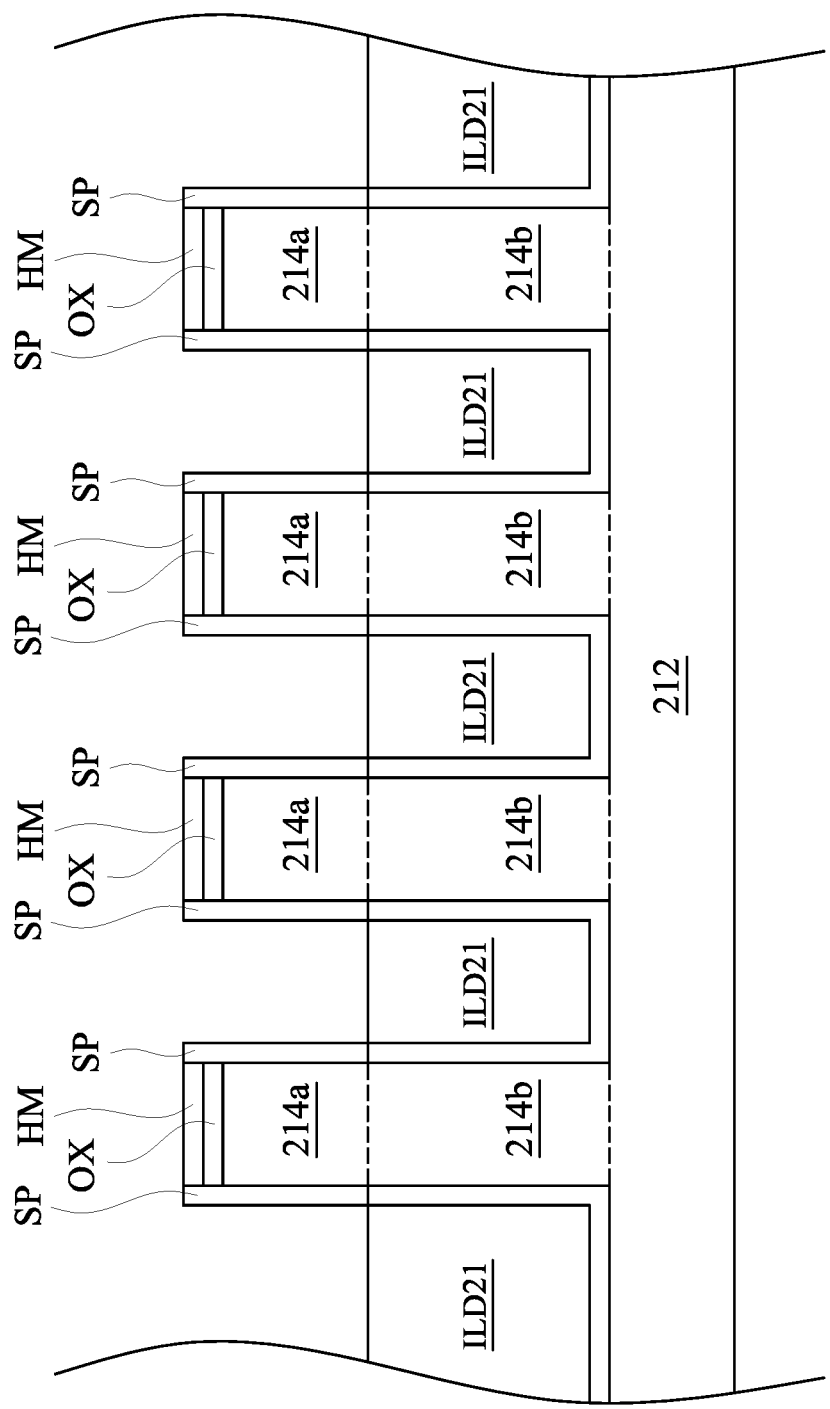
Figure 2I:
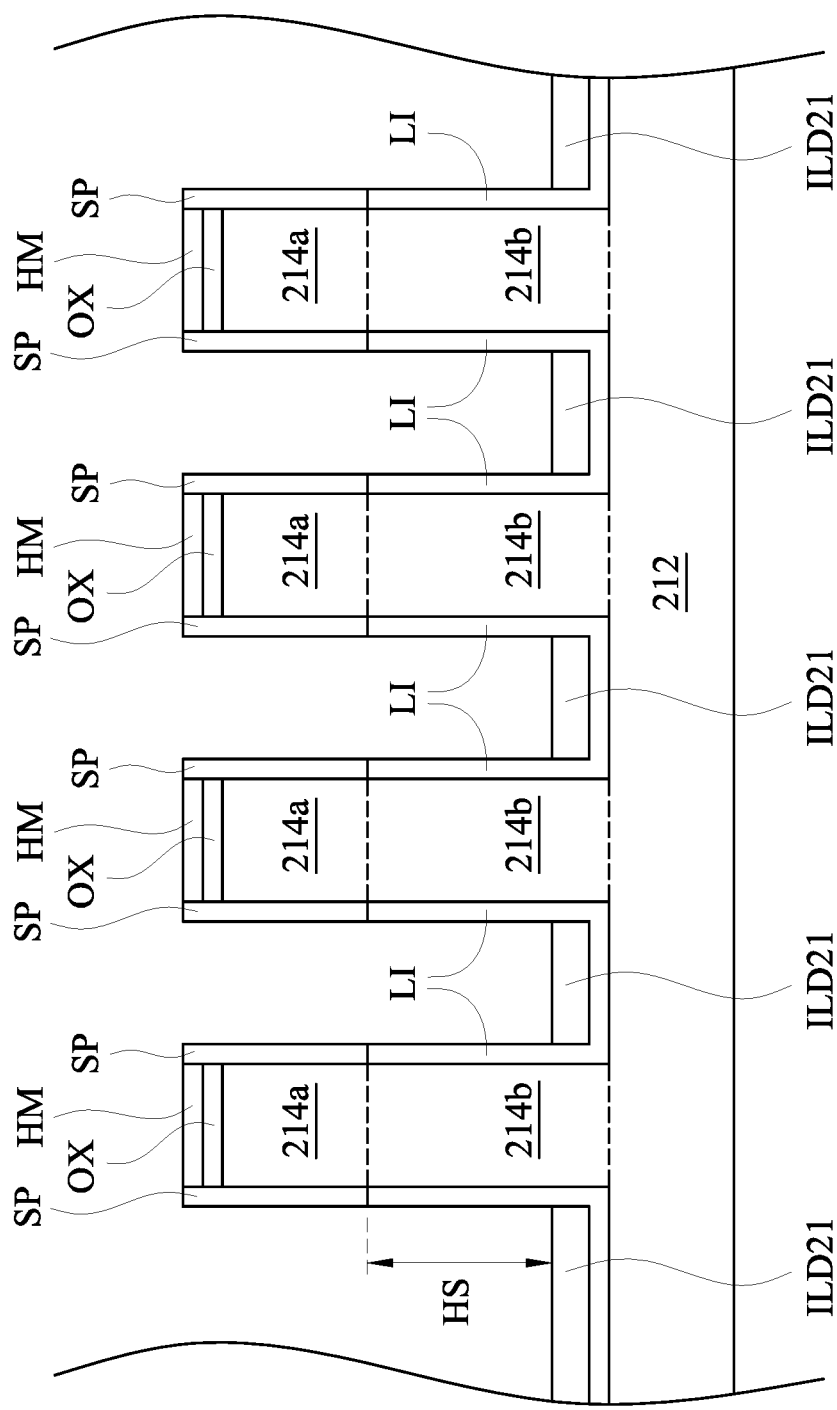
Figure 2J:
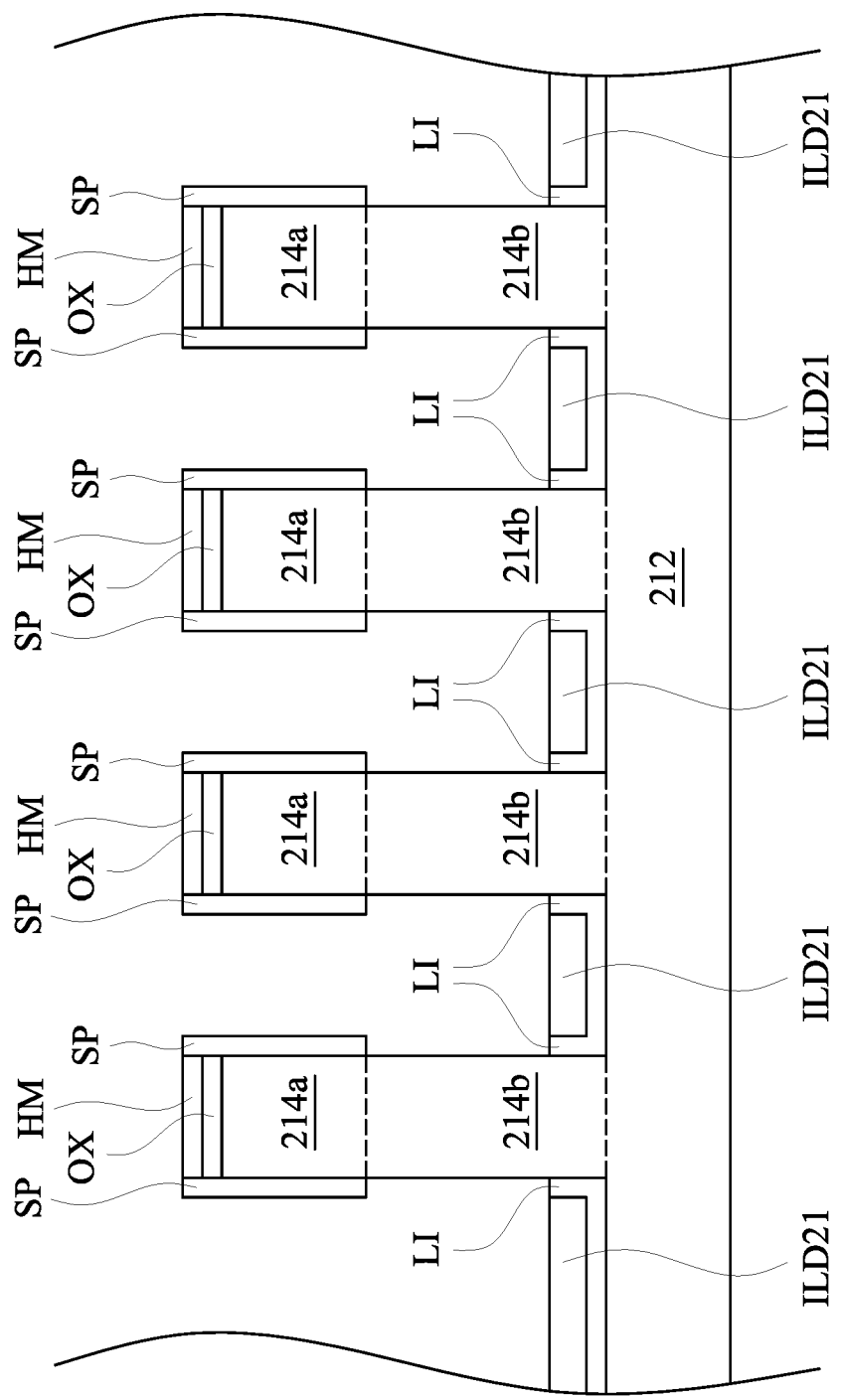
Figure 2K:
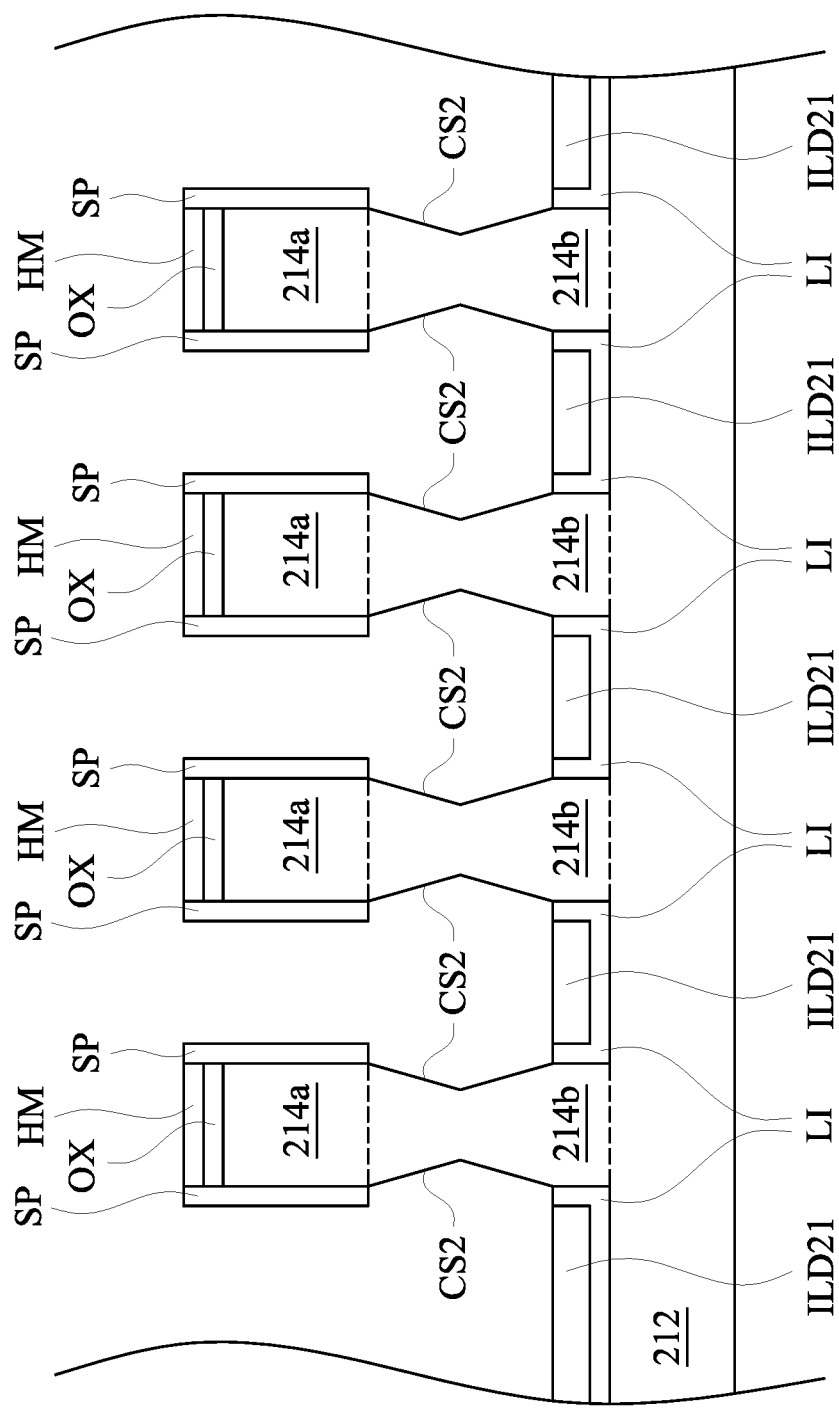
Figure 2L:
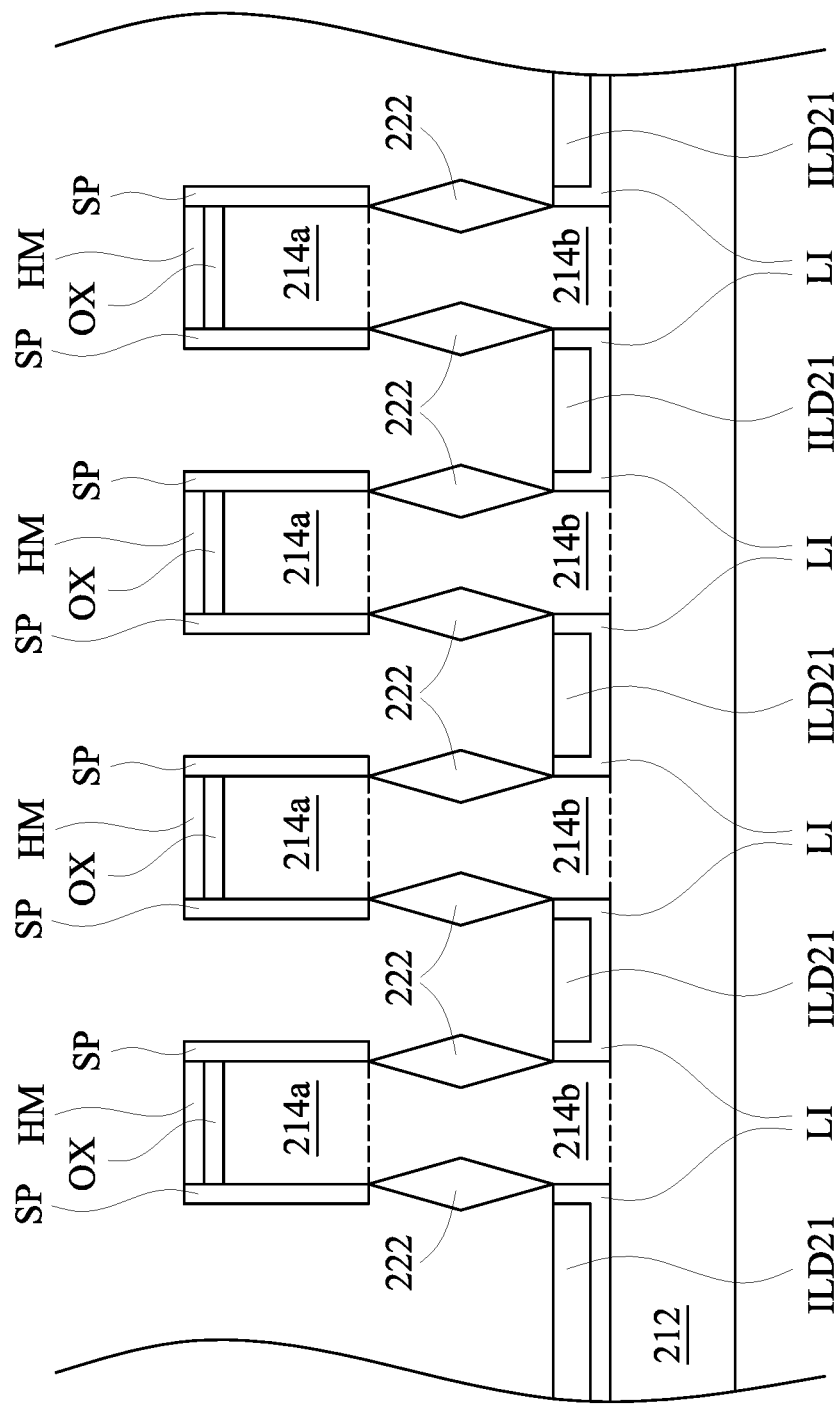
Figure 2M:
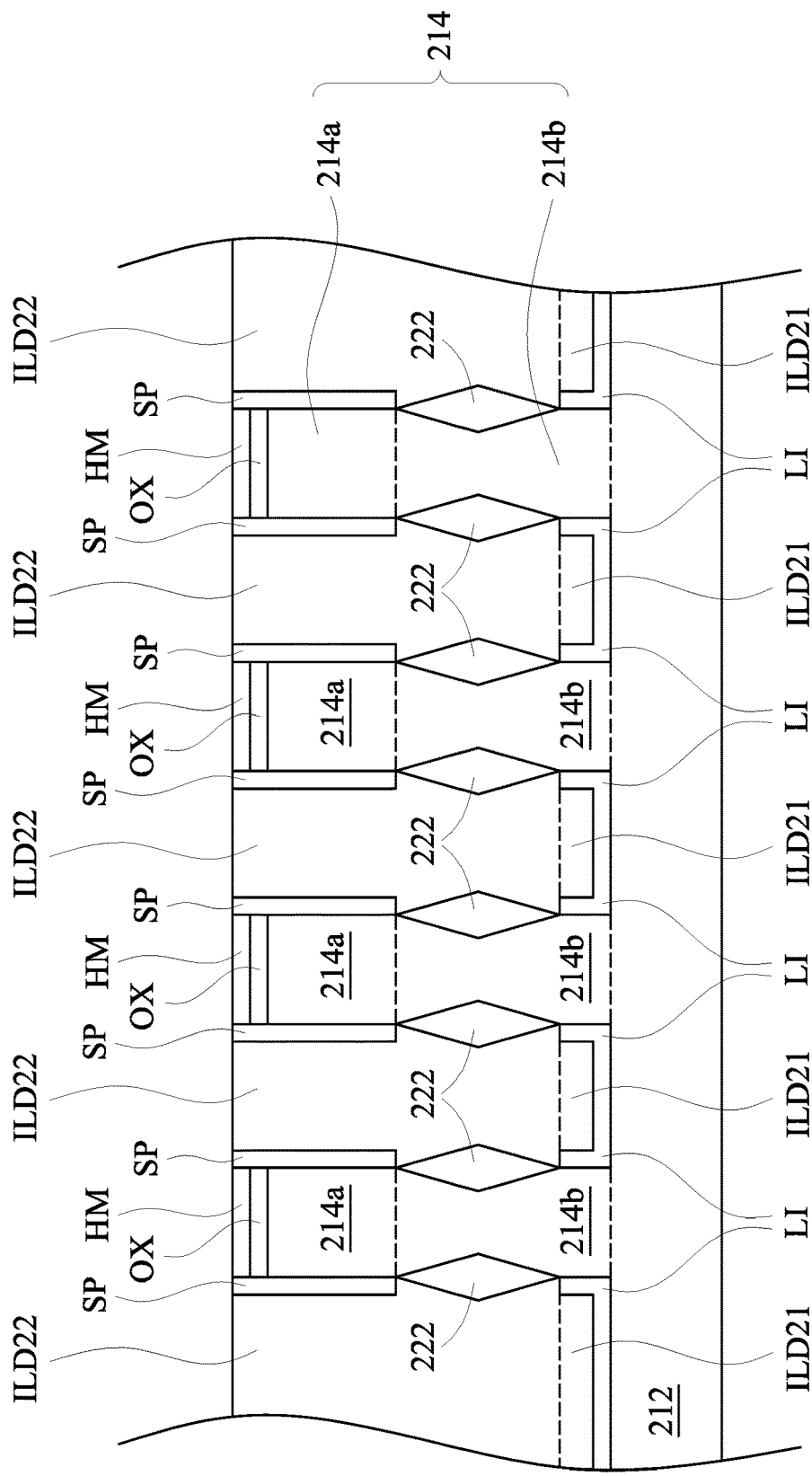
Figure 2N:
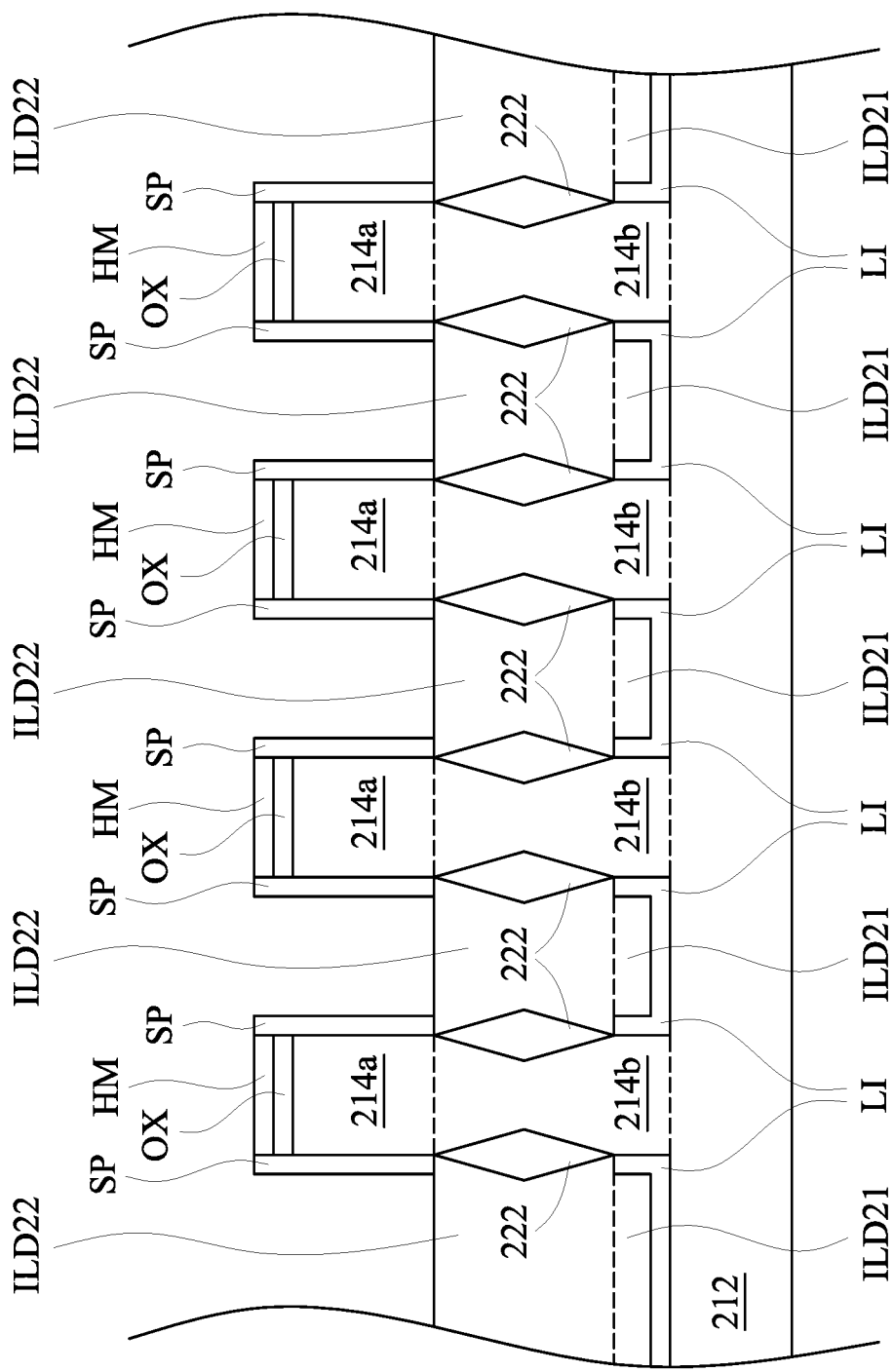
Figure 2O:
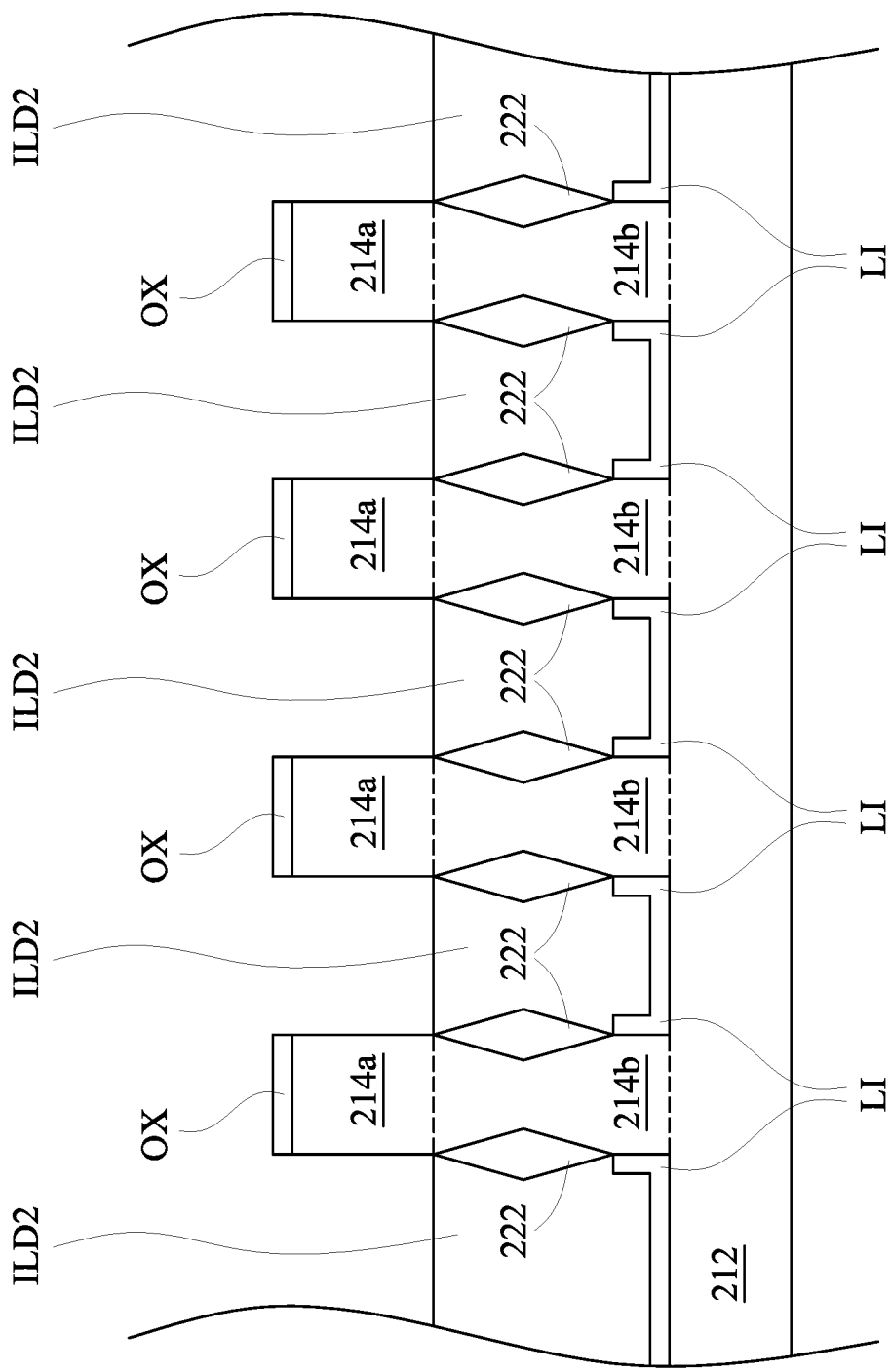
Figure 2P:
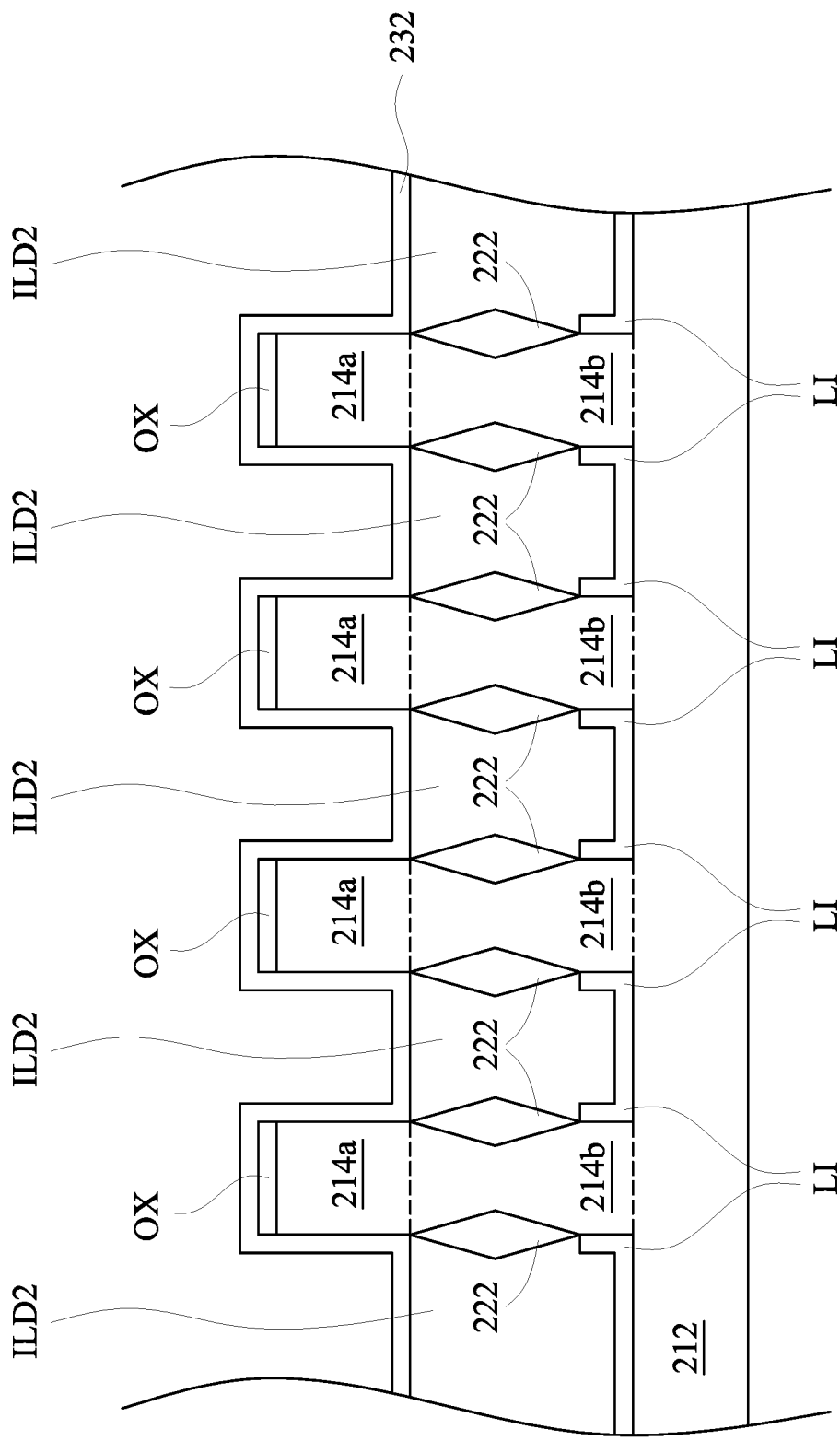
Figure 2Q:
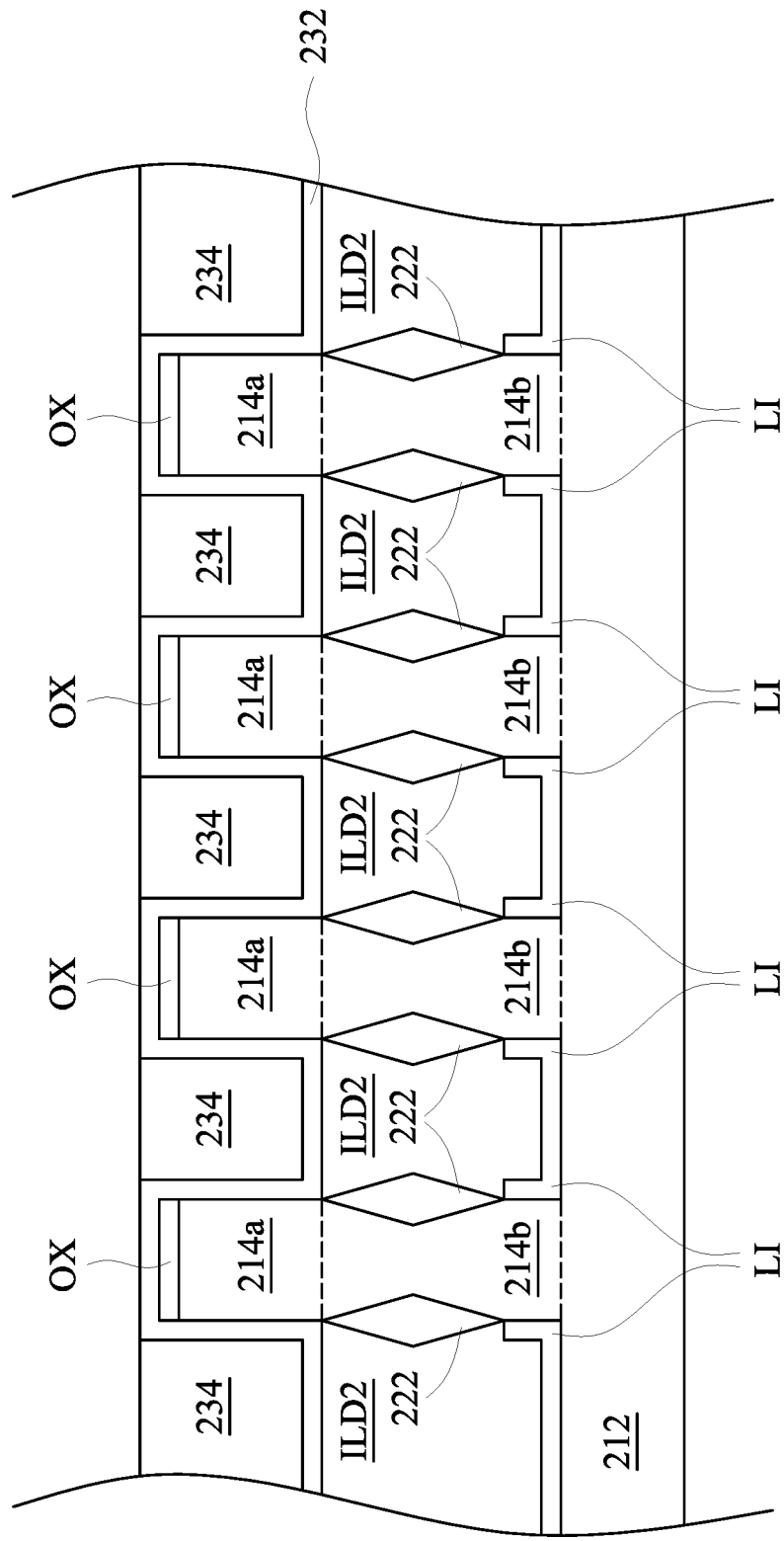
Figure 2R:
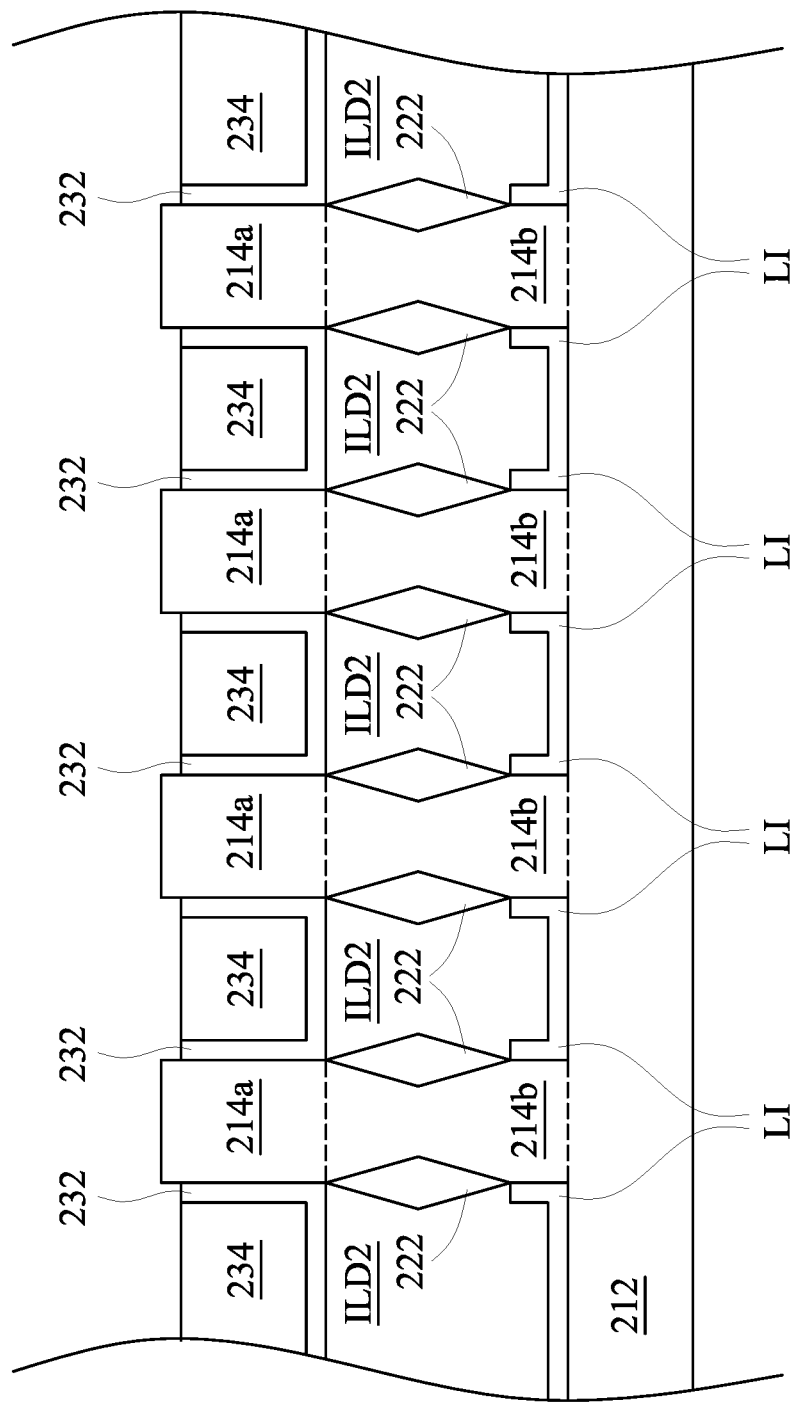
Figure 2S:
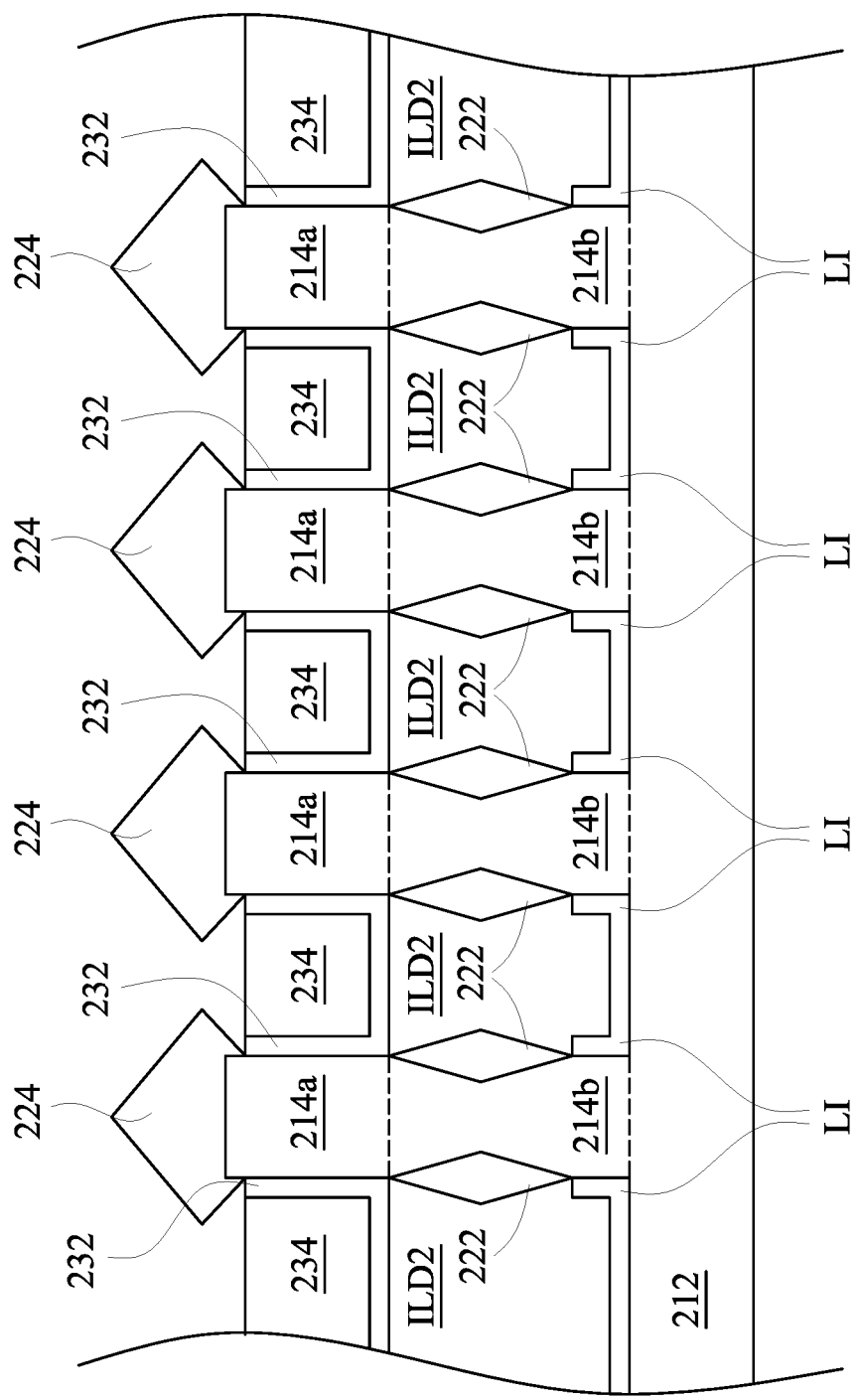
Figure 2T:
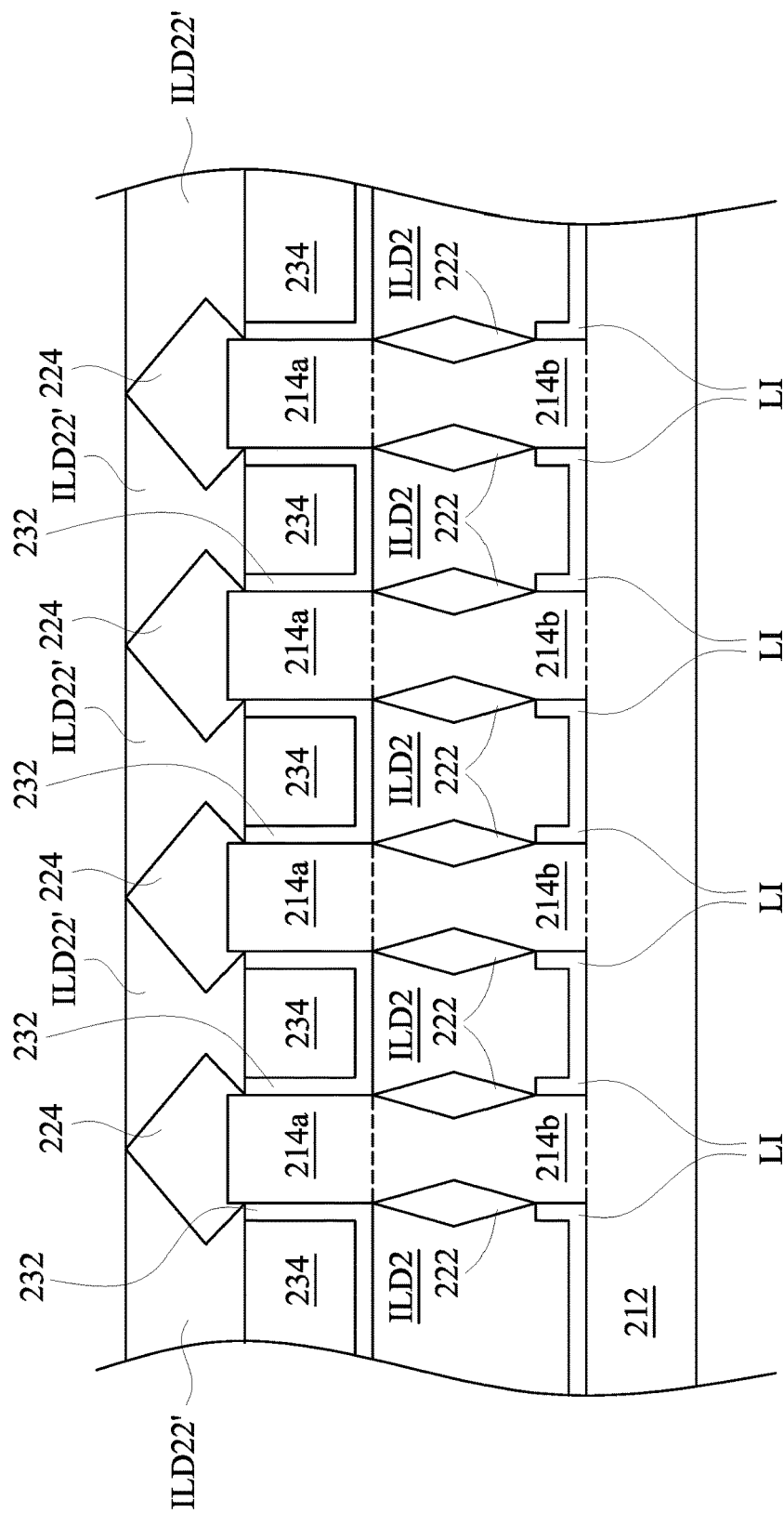

Referring to FIG. 2A to FIG. 2T, FIG. 2A to FIG. 2T are cross-sectional views of intermediate stages showing a method for fabricating a transistor device in accordance with some embodiments of the present disclosure. At first, a semiconductor substrate 210 is provided, as shown in FIG. 2A. In some embodiments, the semiconductor substrate 210 may be a semiconductor material and may include structures including a graded layer or a buried oxide, for example. In some exemplary examples, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 210 may be an active layer of a semiconductor-on-insulator (SOI) substrate or a multi-layered structure such as a silicon-germanium layer formed on a bulk silicon layer.

Then, plural mask layers HM are formed on the semiconductor substrate 210, as shown in FIG. 2B. In some embodiments, the mask layers HM are hard masks, and plural oxide layers OX maybe formed between the mask layers HM and the semiconductor substrate 210. However, embodiments of the present disclosure are not limited thereto. Further, the materials of the mask layers HM and the oxide layers OX can be blanketly deposited on the semiconductor substrate 210, and then etched to form the mask layers HM and the oxide layers OX as shown in FIG. 2B.

Therefore, the semiconductor substrate 210 is patterned by using the mask layers HM to form a bottom portion 212 and plural fin portions 214, as shown in FIG. 2C. In some embodiments, the fin portions 214 are formed perpendicular to the bottom portion 212. In some embodiments, a width WF of each of the fin portions 214 is ranged from about 5 nm to 25 nm, and a pitch PF between adjacent two of the fin portions 214 is ranged from about 10 nm to about 50 nm. However, embodiments of the present disclosure are not limited thereto.

Then, a liner LI is formed to cover the fin portions 214 and the mask layers HM, as shown in FIG. 2D. The liner LI is configured to protect surfaces of the fin portions 214. In some embodiments, the liner LI can be omitted. In some embodiments, the liner LI can be made by oxide or SiN, but embodiments of the present disclosure are not limited thereto.

Thereafter, gaps between the fin portions 214 are filled with dielectric layers ILD21, as shown in FIG. 2E. In some embodiments, the dielectric layers ILD21 are made by oxide. For example, the dielectric layers ILD21 can be made by silicon oxide, but embodiments of the present disclosure are not limited thereto.

Then, the dielectric layers ILD21 are etched to define upper portions 214a and lower portions 214b of the fin portions 214, as shown in FIG. 2F. An interface between the upper portion 214a and the lower portion 214b is defined by the height HD of the etched dielectric layers ILD21. In some embodiments, a portion of the liner LI covering the mask layers HM are also etched.

Thereafter, the liner LI is removed and a spacer film SPF is formed to cover the fin portions 214, the mask layers HM and the dielectric layers ILD21, as shown in FIG. 2G. The spacer film SPF is made by a material having selectivity to silicon or silicon oxide. In some embodiments, the spacer film SPF is made by SiN, SiCN, SiOCN or other suitable material.

Then, the spacer film SPF is patterned to form spacers SP on sidewalls of the fin portions 214, as shown in FIG. 2H. In some embodiments, portions of the spacer film SPF covering the mask layers HM and the dielectric layers ILD21 are removed.

Thereafter, the dielectric layers ILD21 are further etched to define heights HS of sources, as shown in FIG. 2I. In some embodiments, after being etched, the dielectric layers ILD21 remain on the bottom portion 212 of the semiconductor substrate 210.

Then, portions of the liner LI not covered by the dielectric layers ILD21 are removed to expose surfaces of the lower portions 214b of the fin portions 214, as shown in FIG. 2J.

Thereafter, the exposed surfaces of the lower portions 214b of the fin portions 214 are patterned to form recesses CS2 on the lower portions 214b of the fin portions 214, as shown in FIG. 2K. In some embodiments, the lower portions 214b of the fin portions 214 are etched to form the recesses CS2. In some embodiments, the lower portions 214b of the fin portions 214 are laterally etched by using Ammonia (NH$_4$OH), tetramethyl ammonium hydroxide (TMAH) or other suitable solution. After the exposed surfaces of the lower portions 214b of the fin portions 214 are etched, the recesses CS2 are formed along a crystalline direction <111>.

Then, plural sources 222 are formed on the recesses CS2, as shown in FIG. 2L. The sources 222 are formed by using an epitaxial growth process. Because the recesses CS are formed along the crystalline direction <111>, the growth of the sources 222 can be easily controlled to prevent merging of the sources 222 formed on adjacent two of the lower portions 214b of the fin portions 214.

Thereafter, gaps between the fin portions 214 are filled with dielectric layers ILD22, a shown in FIG. 2M. In some embodiments, the dielectric layers ILD22 are made by oxide. For example, the dielectric layers ILD22 can be made by silicon oxide, but embodiments of the present disclosure are not limited thereto. Because the dielectric layers ILD21 and ILD22 are made by the same material in this embodiment, the combination of the dielectric layers ILD21 and ILD22 are referred to as dielectric layers ILD2 hereinafter.

Then, the dielectric layers ILD2 are etched to expose the spacers SP, as shown in FIG. 2N. In some embodiments, the dielectric layers ILD2 are etched to be aligned interfaces between the upper portions 214a and the lower portions 214b of the fin portions 214, thereby exposing the whole spacers SP and protecting the sources 222.

Thereafter, the spacers SP and the mask layers HM are removed to expose the upper portions 214a of the fin portions 214, as shown in FIG. 2O.

Then, a gate dielectric layer 232 is formed to cover the dielectric layers ILD2, the upper portions 214a of the fin portions 214 and the oxide layers, as shown in FIG. 2P. In some embodiments, the gate dielectric layer 232 is a high-k dielectric layer. For example, the gate dielectric layer 232 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

Thereafter, gate electrodes 234 are formed between the upper portions 214a of the fin portions 214, as shown in FIG. 2Q. In some embodiments, the gate electrodes 234 are formed on the gate dielectric layer 232 and touch the gate dielectric layer 232, but embodiments of the present disclosure are not limited thereto.

Then, the gate dielectric layer 232, the gate electrodes 234 and the oxide layers OX are etched to expose the terminals of the upper portions 214a of the fin portions 214, as shown in FIG. 2R. In some embodiments, the gate electrodes 234 are etched back. In some embodiments, portions of the gate dielectric layer 232 located on the terminals the upper portions 214a of the fin portions 214 are removed, and the oxide layers are also removed, thereby exposing the terminals of the upper portions 214a of the fin portions 214.

Thereafter, plural drains 224 are formed on the terminals of the upper portions 214a of the fin portions 214, as shown in FIG. 2S. In some embodiments, the drains 224 are formed by using an epitaxial growth process, and the drains 224 are not merged with each other.

Then, gaps between the drains 224 are filled with dielectric layers ILD2', as shown in FIG. 2T. In some embodiments, the dielectric layers ILD2' can be made by oxide, but embodiments of the present disclosure are not limited thereto.

In some embodiments, the positions of the drains 224 and the sources 222 can be exchanged. For example, the drains 224 can be disposed on the recesses CS2 of the lower portions 214b of the fin portions 214, and the sources 222 can be disposed on the terminals of the upper portions 214a of the fin portions 214.

Figure 3:
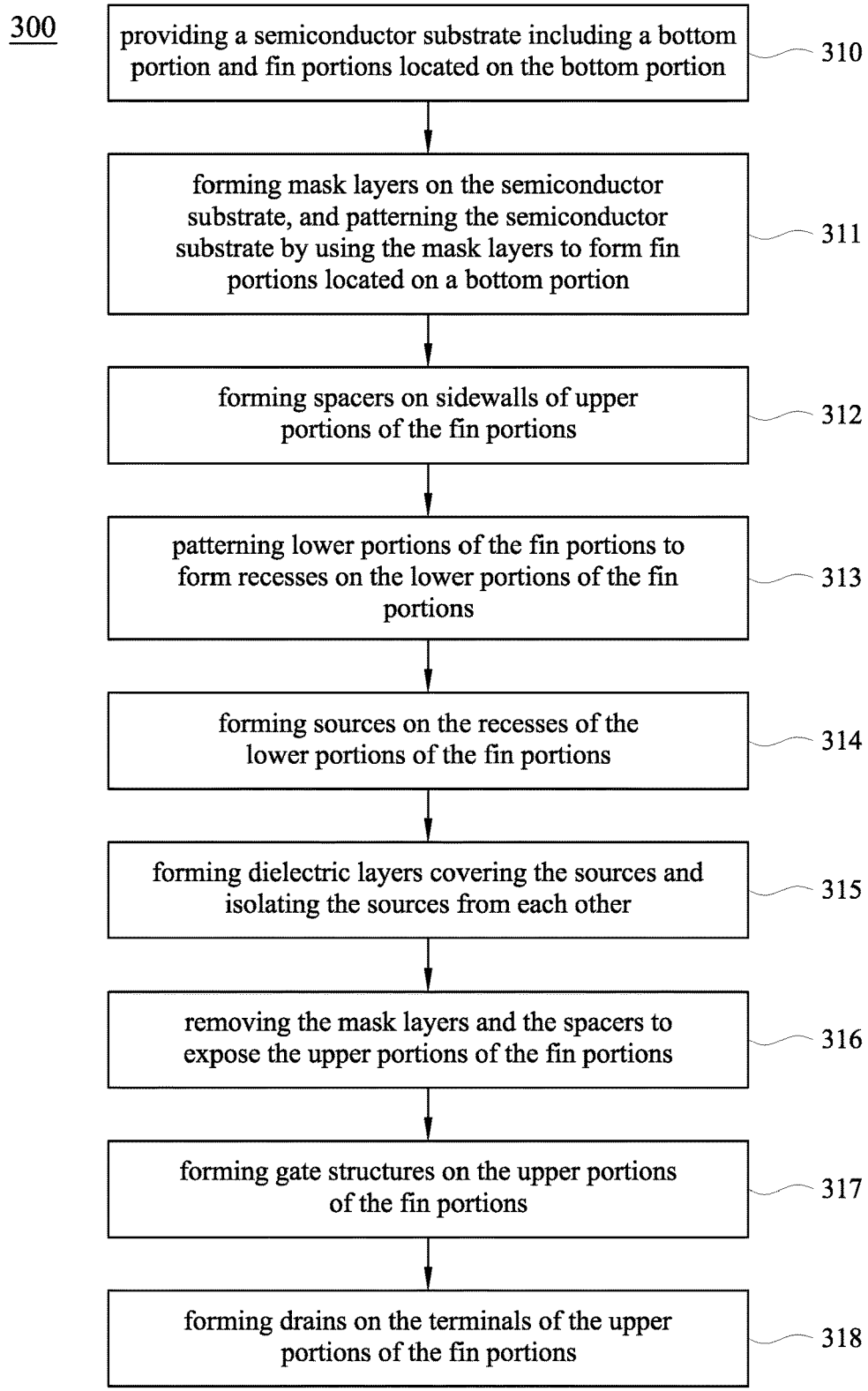
FIG. 3 is a flow chart showing a method for fabricating a transistor device in accordance with embodiments of the present disclosure.

Referring to FIG. 3, FIG. 3 is a flow chart showing a method 300 for fabricating a transistor device in accordance with embodiments of the present disclosure. The method 300 begins at operation 310. In operation 310, the semiconductor substrate 210 is provided as shown in FIG. 2A.

Then, in operation 311, the mask layers HM are formed on the semiconductor substrate 210, and the semiconductor substrate 210 is patterned by using the mask layers HM, as shown in FIG. 2B and FIG. 2C. In some embodiments, the oxide layers OX can be formed between the mask layers HM and the semiconductor substrate 210. However, embodiments of the present disclosure are not limited thereto. In some embodiments, the oxide layers OX can be omitted. Further, the materials of the mask layers HM and the oxide layers OX can be blanketly deposited on the semiconductor substrate 210, and then etched to form the mask layers HM and the oxide layers OX as shown in FIG. 2B. After the forming of the mask layers HM and the oxide layers OX, the semiconductor substrate 210 is patterned to form the bottom portion 212 and the fin portions 214, as shown in FIG. 2C. In some embodiments, the semiconductor substrate 210 can be patterned by using an etching process, but embodiments of the present disclosure are not limited thereto.

In some embodiments, the liner LI can be optionally formed on the fin portions 214 and the mask layers HM, as shown in FIG. 2D, FIG. 2E and FIG. 2F. For example, after the mask layers HM are formed on the fin portions 214, the liner LI is formed to cover the fin portions 214 and the mask layers HM, as shown in FIG. 2E. Then, gaps between the fin portions 214 are filled with the dielectric layers ILD21, and the dielectric layers ILD21 and a portion of the liner LI covering the mask layers HM are etched, as shown in FIG. 2E and FIG. 2F. In some embodiments, the liner LI can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD). In some embodiments, the liner LI can be omitted.

Thereafter, in operation 312, the spacers SP are formed on sidewalls of the upper portions 214a of the fin portions 214, as shown in FIG. 2G and FIG. 2H. For example, after removing the liner LI, the spacer film SPF is formed to cover the fin portions 214 as shown in FIG. 2G. Then, the spacer film SPF is patterned to form the spacers SP on the sidewalls of the fin portions 214, as shown in FIG. 2H. In some embodiments, the spacer film SPF is patterned by using an etching process, but embodiments of the present disclosure are not limited thereto.

Thereafter, in operation 313, the lower portions 214b of the fin portions 214 are patterned to form recesses CS2 on the lower portions 214b of the fin portions 214, as shown in FIG. 2I, FIG. 2J and FIG. 2K. For example, the dielectric layers ILD21 and the portions of the liner LI not covered by the dielectric layers ILD21 are removed to expose surfaces of the lower portions 214b of the fin portions 214, as shown in FIG. 2I and FIG. 2J. Then, the exposed surfaces of the lower portions 214b of the fin portions 214 are patterned to form recesses CS2 on the lower portions 214b of the fin portions 214, as shown in FIG. 2K. In some embodiments, the lower portions 214b of the fin portions 214 are laterally etched by using Ammonia ($NH_4OH$), tetramethyl ammonium hydroxide (TMAH) or other suitable solution. After the exposed surfaces of the lower portions 214b of the fin portions 214 are etched, the recesses CS2 are formed along a crystalline direction <111>.

Then, in operation 314, the source 222 are formed on the recesses CS2 of the lower portions 214b of the fin portions 214, as shown in FIG. 2L. The sources 222 are formed by using an epitaxial growth process. Because the recesses CS are formed along the crystalline direction <111>, the growth of the sources 222 can be easily controlled to prevent merging of the sources 222 formed on adjacent two of the lower portions 214b of the fin portions 214.

Thereafter, in operation 315, the dielectric layers ILD22 are formed to cover the sources 222 and isolate the sources 222 from each other, as shown in FIG. 2M and FIG. 2N. For example, the gaps between the fin portions 214 are filled with dielectric layers ILD22, a shown in FIG. 2M. Then, the dielectric layers ILD22 are etched to expose the spacers SP, as shown in FIG. 2N. In some embodiments, the dielectric layers ILD22 are formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

Then, in operation 316, the mask layers HM and the spacers SP are removed to expose the upper portions 214a of the fin portions 214, as shown in FIG. 2O.

Thereafter, in operation 317, plural gate structures are formed on the upper portions 214a of the fin portions 214, as shown in FIG. 2P, FIG. 2Q and FIG. 2R. For example, at first, the gate dielectric layer 232 is formed to cover the dielectric layers ILD2, the upper portions 214a of the fin portions 214 and the oxide layers, as shown in FIG. 2P. Then, the gate electrodes 234 are formed on the gate dielectric layer 232 and between the upper portions 214a of the fin portions 214, as shown in FIG. 2Q. Thereafter, the gate dielectric layer 232, the gate electrodes 234 and the oxide layers OX are etched to expose the terminals of the upper portions 214a of the fin portions 214, as shown in FIG. 2R.

In some embodiments, the gate dielectric layer 232 and the gate electrodes 234 can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

Then, in operation 318, the drains 224 are formed on the terminals of the upper portions 214a of the fin portions 214, as shown in FIG. 2S. In some embodiments, the drains 224 are formed by using an epitaxial growth process, and the drains 224 are not merged with each other.

Thereafter, in operation 319, the gaps between the drains 224 are filled with the dielectric layers ILD2', as shown in FIG. 2T. In some embodiments, the dielectric layers ILD2' can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

In accordance with an embodiment of the present disclosure, the present disclosure discloses a vertical transistor device. The vertical transistor device includes a semiconductor substrate and sources/drains. The semiconductor substrate includes a bottom portion and a fin portion. The fin portion is located on the bottom portion, in which the fin portion includes an upper portion and a lower portion located between the bottom portion of the semiconductor substrate and the upper portion of the fin portion, in which the lower portion includes recesses. The sources/drains are disposed on the recesses of the lower portion of the fin portion.

In accordance with another embodiment of the present disclosure, the present disclosure discloses a vertical transistor device. The vertical transistor device includes a semiconductor substrate, first sources/drains and second sources/drains. The semiconductor substrate includes a bottom portion and fin portions located on the bottom portion, in which each of the fin portions includes an upper portion and a lower portion. The lower portion is located between the bottom portion of the semiconductor substrate and the upper portion, in which the lower portion includes recesses. The first sources/drains are disposed on a plurality of terminals of the upper portions of the fin portions. The second sources/drains are disposed on the recesses of the lower portions of the fin portions, in which the sources/drains are not merged with each other.

In accordance with another embodiment of the present disclosure, a method for fabricating a vertical transistor device is disclosed. In the method for fabricating a vertical transistor device, at first, a semiconductor substrate is provided. Then, mask layers are formed on the semiconductor substrate, and the semiconductor substrate is patterned by using the mask layers to form plural fin portions located on a bottom portion. Thereafter, spacers are formed on sidewalls of upper portions of the fin portions. Thereafter, lower portions of the fin portions are patterned to form a plurality of recesses on the lower portions of the fin portions, in which the lower portions of the fin portions are located between the bottom portion of the semiconductor substrate and the upper portions of the fin portions. Then, sources are formed on the recesses of the lower portions of the fin portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical transistor device, comprising:
   a semiconductor substrate comprising:
   a bottom portion; and
   a fin portion located on the bottom portion, wherein the fin portion comprises:
   an upper portion; and
   a lower portion located between the bottom portion of the semiconductor substrate and the upper portion of the fin portion, wherein the lower portion comprises a plurality of recesses; and
   a plurality of sources/drains disposed on the recesses of the lower portion of the fin portion, wherein the recesses are formed along a crystalline direction <111>.

2. The vertical transistor device of claim 1, further comprising a gate structure disposed on the upper portion of the fin portion to induce a cannel in the upper portion of the fin portion.

3. The vertical transistor device of claim 1, further comprising a plurality of silicide layers disposed on the sources/drains.

4. A vertical transistor device, comprising:
   a semiconductor substrate comprising:
   a bottom portion; and
   a plurality of fin portions located on the bottom portion, wherein each of the fin portions comprises:
   an upper portion; and
   a lower portion located between the bottom portion of the semiconductor substrate and the upper portion, wherein the lower portion comprises a plurality of recesses; and
   a plurality of first sources/drains disposed on a plurality of terminals of the upper portions of the fin portions;
   a plurality of second sources/drains disposed on the recesses of the lower portions of the fin portions, wherein the second sources/drains are not merged with each other, wherein the recesses are formed along a crystalline direction <111>.

5. The vertical transistor device of claim 4, further comprising a plurality of gate structures disposed on the upper portions of the fin portions to induce a plurality of channels in the upper portions of the fin portions.

6. The vertical transistor device of claim 5, wherein each of the gate structures comprises a gate dielectric layer and a gate electrode disposed on the gate dielectric layer.

7. The vertical transistor device of claim 4, wherein two second sources/drains of two adjacent fin portions have respective front surfaces opposite to each other, and each of the two second sources/drain has a silicide layer covering its front surface.

8. The vertical transistor device of claim 7, further comprising a contact located on the silicide layer.

9. The vertical transistor device of claim 4, further comprises a plurality of first dielectric layers isolating the first sources/drains from each other.

10. The vertical transistor device of claim 9, further comprises a plurality of second dielectric layers isolating the second sources/drains from each other.

11. A method for fabricating a vertical transistor device, comprising:
    providing a semiconductor substrate;
    forming a plurality of mask layers on the semiconductor substrate;
    patterning the semiconductor substrate by using the mask layers to form a plurality of fin portions located on a bottom portion;
    forming a plurality of spacers on a plurality of sidewalls of a plurality of upper portions of the fin portions;
    patterning a plurality of lower portions of the fin portions to form a plurality of recesses on the lower portions of the fin portions, wherein the lower portions of the fin portions are located between the bottom portion of the semiconductor substrate and the upper portions of the fin portions;
    forming a plurality of sources on the recesses of the lower portions of the fin portions;
    forming a dielectric layer covering the fin portions and isolating the sources from each other;
    removing the mask layers and the spacers to expose the upper portions of the fin portions;
    forming a plurality of gate structures on the upper portions of the fin portions; and
    forming a plurality of drains on the terminals of the upper portions of the fin portions.

12. The method of claim 11, wherein forming the gate structures on the upper portions of the fin portions comprising:
    forming a gate dielectric layer on the upper portions of the fin portions;
    forming a plurality of gate electrodes on the gate dielectric layer; and
    removing a plurality of portions of the gate dielectric layer to exposes the terminals of the upper portions of the fin portions.

13. The method of claim 12, wherein forming the gate structures on the upper portions of the fin portions further comprising etching back the gate electrodes.

14. The method of claim 13, wherein the sources are formed by using an epitaxial growth process.

15. The method of claim 14, wherein the recesses are formed along a crystalline direction <111>.

16. The method of claim 15, wherein the recesses are formed by using Ammonia ($NH_4OH$) or tetramethyl ammonium hydroxide (TMAH).

17. The method of claim 15, wherein forming the sources on the recesses of the lower portions of the fin portions comprising controlling the epitaxial growth process to enable the sources to be non-merged.

18. The method of claim 11, further comprising forming a plurality of silicide layers on the sources and the drains.

19. The method of claim 11, wherein the drains are formed by using an epitaxial growth process.

20. The method of claim 11, wherein patterning the lower portions of the fin portions comprising laterally etching the lower portions of the fin portions.

* * * * *